(12) United States Patent
Apanius et al.

(10) Patent No.: US 9,425,404 B2
(45) Date of Patent: Aug. 23, 2016

(54) THERMO-OXIDATIVELY STABLE, SIDE CHAIN POLYETHER FUNCTIONALIZED POLYNORBORNENES FOR MICROELECTRONIC AND OPTOELECTRONIC DEVICES AND ASSEMBLIES THEREOF

(71) Applicants: Promerus LLC, Brecksville, OH (US); Sumitomo Bakelite Co., Ltd., Tokyo (JP)

(72) Inventors: Christopher Apanius, Moreland Hills, OH (US); Andrew Bell, Lakewood, OH (US); Cheryl Burns, Bristolville, OH (US); Crystal Cyrus, Brecksville, OH (US); Edmund Elce, Lakewood, OH (US); Royce Groff, Solon, OH (US); Sridevi Kaiti, Broadview Heights, OH (US); Brian Knapp, Medina, OH (US); Hendra Ng, Highland Heights, OH (US); Seishi Ohashi, Tokyo (JP); Wei Zhang, Brecksville, OH (US)

(73) Assignees: PROMERUS, LLC, Brecksville, OH (US); SUMITOMO BAKELITE CO., LTD., Tokyo (JP)

( * ) Notice: Subject to any disclaimer, the term of this patent is extended or adjusted under 35 U.S.C. 154(b) by 115 days.

(21) Appl. No.: 13/741,809

(22) Filed: Jan. 15, 2013

(65) Prior Publication Data
US 2013/0181199 A1  Jul. 18, 2013

Related U.S. Application Data

(60) Provisional application No. 61/586,950, filed on Jan. 16, 2012, provisional application No. 61/601,752, filed on Feb. 22, 2012.

(51) Int. Cl.
| | | |
|---|---|---|
| *H01L 51/00* | (2006.01) |
| *C08F 232/08* | (2006.01) |
| *G03F 7/039* | (2006.01) |
| *G03F 7/022* | (2006.01) |
| *G03F 7/023* | (2006.01) |
| *G03F 7/038* | (2006.01) |

(52) U.S. Cl.
CPC .......... *H01L 51/0043* (2013.01); *C08F 232/08* (2013.01); *G03F 7/0226* (2013.01); *G03F 7/0233* (2013.01); *G03F 7/038* (2013.01); *G03F 7/039* (2013.01); *G03F 7/0395* (2013.01); *H01L 51/004* (2013.01)

(58) Field of Classification Search
CPC . H01L 51/0043; H01L 51/004; C08F 232/08; G03F 7/0395; G03F 7/0226; G03F 7/039
USPC .......................................................... 257/40
See application file for complete search history.

(56) References Cited

U.S. PATENT DOCUMENTS

| | | | |
|---|---|---|---|
| 2,721,177 A | 10/1955 | Harle | |
| 3,450,671 A | 6/1969 | Tholstrup | |
| 4,205,158 A | 5/1980 | Hoeschele | |
| 4,797,511 A | 1/1989 | Capolupo et al. | |
| 4,837,259 A | 6/1989 | Chucta | |
| 5,268,394 A | 12/1993 | Wheeler et al. | |
| 6,080,929 A * | 6/2000 | Fagouri et al. | 174/23 C |
| 6,380,290 B1 | 4/2002 | Bonte et al. | |
| 6,569,927 B1 | 5/2003 | Gelbin | |
| 6,986,864 B2 | 1/2006 | Porter | |
| 7,459,774 B2 | 12/2008 | Kwon et al. | |
| 7,524,594 B2 | 4/2009 | Amoroso et al. | |
| 7,862,969 B2 | 1/2011 | Suzuki et al. | |
| 8,030,425 B2 | 10/2011 | Apanius et al. | |
| 8,110,532 B2 | 2/2012 | Dong | |
| 2009/0005478 A1* | 1/2009 | Gelbin et al. | 524/186 |
| 2010/0029815 A1 | 2/2010 | Palmer et al. | |
| 2010/0029819 A1 | 2/2010 | Palmer et al. | |
| 2010/0029821 A1 | 2/2010 | Palmer et al. | |
| 2011/0028621 A1 | 2/2011 | Martens et al. | |
| 2011/0070543 A1 | 3/2011 | Knapp et al. | |
| 2011/0224346 A1* | 9/2011 | Eibeck et al. | 524/413 |
| 2011/0234952 A1* | 9/2011 | Shi | 349/117 |
| 2012/0101196 A1* | 4/2012 | Sakamoto et al. | 524/89 |

OTHER PUBLICATIONS de Sainte Claire, "Degradation of PEO in the Solid State: A Theoretical Kinetic Model", Macromolecules, vol. 42, pp. 3469-3482, (2009).

Botelho, et.al., "Laurolactam as a stabilizer against the thermo-oxidative degradation of poly(ether-esters)", Polymer Degradation and Stability, vol. 85, pp. 991-995, (2004).

Tanikella, et.al., "Rapid Curing of Positive Tone Photosensitive Polybenzoxazole Based Dielectric Resin by Variable Frequency Microwave Processing", IEEE Trans on Components and Packaging Technologies, vol. 29 (2). pp. 411-419, (2006).

Allcock, et.al., "Synthesis and Characterization of Novel Solid Polymer Electrolytes Based on Poly (7-oxanorbomenes) with Pendant Oligoethyleneoxy-functionalized Cyclotriphosphazenes", Macromolecules, vol. 36, pp. 3563-3569, (2003).

(Continued)

*Primary Examiner* — John Uselding
(74) *Attorney, Agent, or Firm* — Balaram Gupta

(57) ABSTRACT

The present invention relates to polynorbornene (PNB) composition embodiments that are useful for forming microelectronic and/or optoelectronic devices and assemblies thereof, and more specifically to compositions encompassing PNBs having norbornene-type repeating units that are polyether functionalized and an additive package containing a phenolic antioxidant and a synergist, and the microelectronic and/or optoelectronic devices made therefrom are resistant to thermo-oxidative chain degradation of said polyether functionalization.

11 Claims, 5 Drawing Sheets

(56) References Cited

OTHER PUBLICATIONS

Pascal de Sainte Claire, Degradation of PEO in the Solid State: A Theoretical Kinetic Model, Macromolecules, 2009, vol. 42, No. 10, pp. 3469-3482.

G. K. Jones, et al., Studies of the Stability of Poly(ethylene oxide) and PEO-Based Solid Electrolytes Using Thermogravimetry-Mass Spectrometry, Macromolecules, 1991, vol. 24, No. 11, pp. 3285-3290.

* cited by examiner

THERMO-OXIDATIVELY STABLE, SIDE CHAIN POLYETHER FUNCTIONALIZED POLYNORBORNENES FOR MICROELECTRONIC AND OPTOELECTRONIC DEVICES AND ASSEMBLIES THEREOF

CROSS-REFERENCE TO RELATED APPLICATIONS

This application claims the benefit of priority to Provisional Patent Application Ser. No. 61/586,950 filed Jan. 16, 2012 and Provisional Patent Application Ser. No. 61/601,752 filed Feb. 22, 2012, the entire contents of which are incorporated herein by reference.

TECHNICAL FIELD

Embodiments in accordance with the present invention relate generally to polynorbornene (PNB) compositions that are useful for forming microelectronic and/or optoelectronic devices and assemblies thereof, and more specifically to compositions encompassing PNBs having norbornene-type repeating units that are polyether functionalized where such PNBs are resistant to thermo-oxidative chain degradation of said polyether functionalization.

BACKGROUND

Organic polymer materials are increasingly being used in the microelectronics and optoelectronics industries for a variety of applications. For example, the uses for such organic polymer materials include interlevel dielectrics, redistribution layers, stress buffer layers, leveling or planarization layers, alpha-particle barriers for microelectronic and optoelectronic devices. Such devices including microelectromechanical systems and optoelectromechanical systems as well as the direct adhesive bonding of devices and device components to form such systems. Where such organic polymer materials are photosensitive, and thus self-imagable, they offer the additional advantage of reducing the number of processing steps required for the use of such layers and structures made therefrom.

While polyimide (PI), polybenzoxazole (PBO) and benzocyclobutane (BCB) compositions have been materials of choice for many of the aforementioned applications due to their generally good thermal stability and mechanical strength, each of the above materials are either formed during curing from precursors that react to modify the polymer's backbone (PI and PBO) or to form such backbone (BCB) and thus generally require special handling conditions during curing to remove by-products that are formed during such curing and/or to exclude oxygen or water vapor that can prevent such curing. Additionally, the curing of such materials often requires process temperatures in excess of 250° C. (and as high as 400° C. for some materials). Therefore such materials can be problematic for some applications, e.g., redistribution and interlayer dielectric layers as well as direct adhesive bonding of a transparent cover over image sensing arrays.

Therefore it is believed that it would be advantageous to provide a material, useful for forming the aforementioned structures, that exhibits thermal stability and mechanical strength equivalent to the known PI, PBO, and BCB compositions, where such a material has a fully formed polymer backbone that allows for curing at temperatures of 200° C. or lower. Further, such an advantageous material should be tailorable in its characteristics to provide appropriate levels or values of stress, modulus, dielectric constant, elongation to break and permeability to water vapor for the application for which it is intended. Still further, it would be advantageous for such a material to be self-imagable.

BRIEF DESCRIPTION OF THE DRAWINGS

Embodiments in accordance with the present invention are described hereinbelow with reference to the following accompanying drawings.

DETAILED DESCRIPTION

Figure 1:
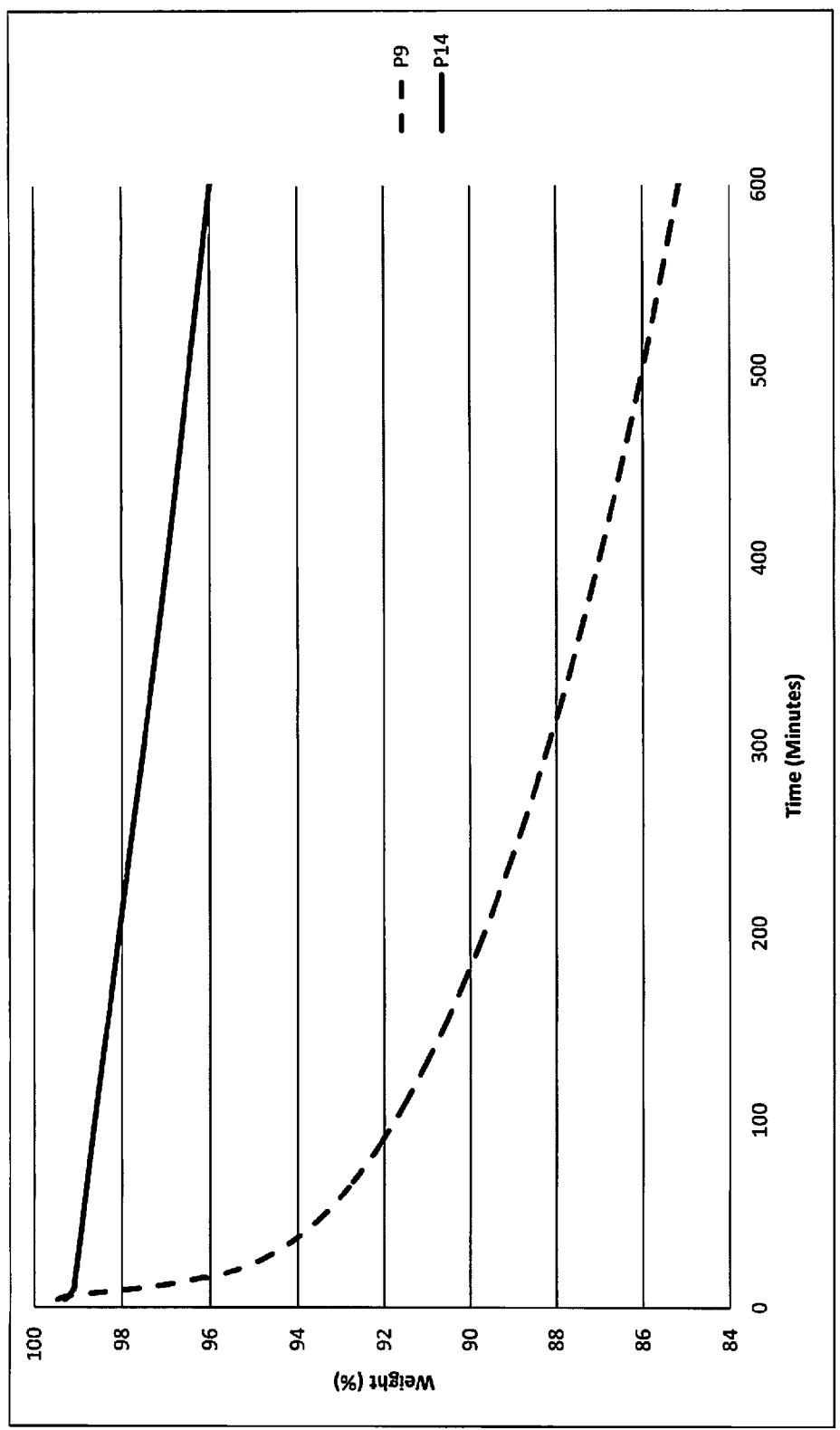
FIG. 1 is a chart showing the weight loss of polymers P9 and P14 over 600 minutes while heated to 200° C.

Embodiments in accordance with the present invention are directed to norbornene-type polymers, self-imagable compositions that encompass such polymers and the films, layers, structures, devices or assemblies that can be formed using such polymers and compositions. Some of such embodiments encompass self-imagable compositions which can provide positive-tone images, after image-wise exposure of a film formed thereof, followed by development of such images, using an aqueous base developer solution. While other of such embodiments encompass self-imagable compositions which can provide negative-tone images, after image-wise exposure of a film formed thereof, followed by development of such images, using an appropriate solvent based developer.

Further, the aforementioned embodiments can routinely provide thick films of 5 microns (μm) or greater and images demonstrating aspect ratios in excess of 1:2 for isolated line/trench resolution in such films. The films, layers, and structures formed from the polymer embodiments of the present invention being useful for, among other things, interlevel dielectrics, redistribution layers, stress buffer layers, leveling or planarization layers, alpha-particle barriers for both microelectronic and optoelectronic devices and the assemblies formed thereof, as well as adhesive bonding to form chip-stacks and to fixably attach transparent covers over image arrays.

Unless otherwise indicated, all numbers, values and/or expressions referring to quantities of ingredients, reaction conditions, polymer compositions, and formulations used herein are to be understood as modified in all instances by the term "about" as such numbers are inherently approximations that are reflective of, among other things, the various uncertainties of measurement encountered in obtaining such values. Further, where a numerical range is disclosed herein, such range is continuous, and includes unless otherwise indicated, every value from the minimum value to and including the maximum value of such range. Still further, where such a range refers to integers, unless otherwise indicated, every integer from the minimum value to and including the maximum value is included. In addition, where multiple ranges are provided to describe a feature or characteristic, such ranges can be combined to further describe such a feature or characteristic.

As used herein, the articles "a," "an," and "the" include plural referents unless otherwise expressly and unequivocally limited to one referent.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof.

It will be understood that the terms "dielectric" and "insulating" are used interchangeably herein. Thus, reference to an insulating layer is inclusive of a dielectric layer.

As used herein, the term "polymer" will be understood to mean a molecule that encompasses a backbone of one or more distinct types of repeating units (the smallest constitutional unit of the polymer) and is inclusive of, in addition to the polymer itself, residues from initiators, catalysts, and other elements attendant to the forming of such a polymer, where such residues are understood as not being covalently incorporated thereto. Further, such residues and other elements, while normally removed during post polymerization purification processes, are typically mixed or co-mingled with the polymer such that some small amount generally remains with the polymer when it is transferred between vessels or between solvents or dispersion media.

As used herein, the term "polymer composition" is meant to include at least one synthesized polymer, as well as materials added after the forming of the polymer(s) to provide or modify specific properties of such composition. Exemplary materials that can be added include, but are not limited to, solvents, photoactive compounds (PAC), dissolution rate inhibitors, dissolution rate enhancers, crosslinking moieties, reactive diluents, antioxidants, adhesion promoters, and plasticizers.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method DI708-95. Films having a low modulus are understood to also have low internal stress.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imagable compositions" will be understood to mean a material that is photodefinable and can thus provide patterned layers and/or structures after direct image-wise exposure of a film formed thereof followed by development of such images in the film using an appropriate developer.

As used herein, "hydrocarbyl" refers to a radical of a group that contains only carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen atom has been replaced by a halogen atom. The term perhalocarbyl refers to a hydrocarbyl group where all hydrogens have been replaced by halogens. The term "heterohydrocarbyl" refers to any of the previously described hydrocarbyls, halohydrocarbyls, and perhalohydrocarbyls where at least one carbon atom of the carbon chain is replaced with a N, O, S, Si or P atom. Non-limiting examples include heterocyclic aromatic groups such as pyrrolyl, furanyl, and the like, as well as non-aromatic groups such as ethers, thioethers and silyl ethers. The term "alkylol" refers specifically to heteroalkyl groups that include one or more hydroxyl (—OH) groups. Non-limiting examples include $NBCH_2OH$, NBEtOH, NBBuOH, $NBCH_2OCH_2CH_2OH$, and $NBCH(CH_2OH)_2$, where "NB" refers to Structural Formula I. As used herein, "alkyl" refers to a linear or branched acyclic or cyclic, saturated hydrocarbon group having a carbon chain length of, for example, from $C_1$ to $C_{25}$. Non-limiting examples of suitable alkyl groups include, but are not limited to, —$CH_3$, —$C_2H_5$, —$(CH_2)_3CH_3$, —$(CH_2)_4$—$CH_3$, —$(CH_2)_5CH_3$, —$(CH_2)_9CH_3$, —$(CH_2)_{23}CH_3$, cyclopentyl and cyclohexyl.

As used herein the term "aryl" refers to aromatic groups that include, without limitation, groups such as phenyl, biphenyl, xylyl, naphthalenyl, anthracenyl and the like.

The terms "alkaryl" or "aralkyl" are used herein interchangeably and refer to a linear or branched acyclic alkyl group substituted with at least one aryl group, for example, phenyl, and having an alkyl carbon chain length of $C_1$ to $C_{25}$. Non-limiting examples would be benzyl, phenethyl, and phenbutyl. It will further be understood that the above acyclic alkyl group can be a haloaralkyl or perhaloaralkyl group. Non-limiting examples would be pentafluorophenmethyl, pentafluorophenethyl, and pentafluorophenbutyl.

As used herein the term "alkenyl" refers to a linear or branched acyclic or cyclic hydrocarbon group having one or more double bonds and having an alkenyl carbon chain length of $C_2$ to $C_{25}$. Non-limiting examples include, among others, ethenyl or vinyl groups, propenyl, butenyl, cyclohexenyl, and the like.

It will additionally be understood that any of the hydrocarbyl, halohydrocarbyl and perhalohydrocarbyl moieties, or their "hetero" analogs, described above can be further substituted, if desired, or can be a divalent radical thereof. Non-limiting examples of suitable substituent groups include, among others, hydroxyl groups, carboxylic acid and carboxylic acid ester groups, amides and imides.

As used herein, the terms "polycycloolefin", "poly(cyclic) olefin", and "norbornene-type" are interchangeably used to refer to addition polymerizable monomers, the resulting repeating units in the resulting polymers or the compositions that encompass such polymers, where such monomers, repeating units of such resulting polymers encompass at least one norbornene-type moiety. The simplest norbornene-type polymerizable monomer encompassed by embodiments in accordance with the present invention is norbornene itself, bicyclo[2.2.1]hept-2-ene, as shown below:

However, the term norbornene-type monomer, norbornene-type repeating unit or norbornene-type polymer (PNB) as used herein is not limited to such moieties that encompass only norbornene itself, but rather to any substituted norbornene(s), or substituted and unsubstituted higher cyclic derivatives thereof.

Published US Patent Application No. US 2011-0070543 A1 (the '543 publication) discloses a negative tone, aqueous-base developable PNB composition that encompasses a norbornenyl-2-trifluoromethyl-3,3,3-trifluoropropan-2-ol (HFANB)/Ethyl norbornenylpropanoate (EPEsNB) polymer having a molar ratio of 75/25, with a photo acid generator compound (PAG), a photo sensitizer, adhesion promoters, and crosslinker additives, e.g., Example 12-8. Further, such '543 publication discloses, in Examples 12-1, 12-2 and 12-3, positive tone compositions that encompass the aforementioned polymer and appropriate additives. This reference to the above Examples of the '543 publication is provided to establish that the current state of the art, to which this disclosure is directed only provided a negative tone composition having acceptable self-imaging capability since the positive tone compositions that were provided did not exhibiting an acceptable self-imagining capability.

Still further, while the '543 publication discloses polymers and polymer compositions that encompass trioxanonanenorbornene (NBTON), it was found that such NBTON-containing compositions despite having advantageous characteristics and/or properties such compositions did not exhibit acceptable positive tone imageability.

In general, polymer composition embodiments of the present invention suitable as positive tone compositions exhibit one or more of the following characteristics in addition to being self-imagable and capable of resolving isolated line/trench features having an aspect ratio of greater than 1:2 in polymer films having a thickness of at least 5 μm:
 i. Positive tone photolithography patterning with 0.26N TMAH developer, or other commonly employed aqueous base developer, solubility;
 ii. A dielectric constant of less than 4;
 iii. Good oxidative stability, as measured by the stability of the polymer's elongation to break (ETB) during HTS stability testing at 150° C. for 100 hours;
 iv. Direct contact adhesion to glass and/or silicon wafers during an appropriate thermocompression bonding process; and
 v. A low modulus, or internal stress, of a cured polymer film.

Although the '543 publication disclosures a family of aqueous base developable PNB compositions, as mentioned above, such family does not include positive tone, aqueous base developable polymer compositions.

As mentioned above, some polymer composition embodiments in accordance with the present invention encompass negative-tone photodefinable polymers. Such embodiments being useful for direct adhesive bonding, as described herein, or as dielectric or redistributions layers, as also described herein. Further, such embodiments exhibit one or more of the following characteristics, in addition to being self-imagable and capable of resolving isolated line/trench features having an aspect ratio of greater than 1:2 in polymer films having a thickness of at least 5 μm:
 a. Negative tone photolithography patterning with an appropriate solvent developer;
 b. A dielectric constant of less than 6;
 c. An appropriate level of permeability to water vapor;
 d. Direct contact adhesion to glass and/or silicon during an appropriate thermo-compression bonding process; and
 e. A low modulus, or internal stress, of a cured polymer film.

Structural Formula I and Ia shown below, are representative of norbornene-type monomers and corresponding norbornene-type repeating units, respectively, that are in accordance with embodiments of the present invention:

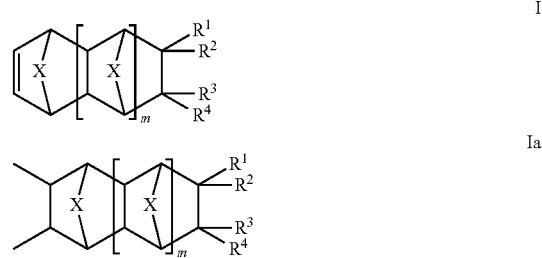

where for each of Formulae I and Ia, X is selected from —$CH_2$—, —$CH_2$—$CH_2$—, O and S; m is an integer from 0 to 5 and each occurrence of $R^1$, $R^2$, $R^3$ and $R^4$ independently represents hydrogen, a hydrocarbyl or another substituent.

Norbornene-type polymers present in polymer composition embodiments in accordance with the present invention are derived from a 2,3 enchainment polymerization process (also known as vinyl addition polymerization) and have at least two distinct types of repeat units, and in some embodiments as many as three, four or five distinct types of repeat units, in accordance with Structural Formula Ia, that are derived from monomers in accordance with Formula I, as described above.

Exemplary polymer embodiments in accordance with the present invention, encompass a first of the at least two distinct types of repeating units having one of $R^1$-$R^4$ being a radical represented by Formula A where s is selected from 0 to 3, t is selected from 2 to 4, u is selected from 1 to 3, and $R^7$ is selected from methyl, ethyl, n-propyl or i-propyl.

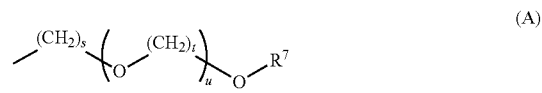

Such distinct type of repeat unit being useful for providing a desired degree of stress, modulus, plasticization, adhesion, and water vapor permeability. Additionally, the short polyether side chains imparts improved aqueous base solubility for a positive tone formulation compared to incorporating a $C_8$-$C_{12}$ alkyl pendent group, e.g. an n-decyl pendent group, while still allowing for solubility in appropriate solvent developers for negative tone formulations.

In some embodiments a repeating unit encompassing such pendent group, or radical in accordance with Formula A, is derived from the following norbornene-type monomers: $NBCH_2(OCH_2CH_2)_3OCH_3$ (NBTODD), $NBCH_2$ (OCH₂CH₂)₂OCH₃ (NBTON), NBCH₂CH₂(OCH₂CH₂CH₂)OCH₃ (NB-3-MBM) or NBCH₂—(OCH₂CH₂CH₂)OCH₃ (NB-3-MPM), where "NB" refers to Structural Formula I.

While all polymer embodiments in accordance with the present invention encompass the above described first distinct type of repeating unit, as it will be seen below, other repeating units encompassed by such polymer embodiments are selected to provide properties to such polymer embodiments that are appropriate and desirable for the use for which such embodiments are directed, thus such polymer embodiments are tailorable to a variety of specific applications.

For example, polymer embodiments generally require at least one repeating unit directed to providing imageability. Thus distinct types of repeating units, represented by Structural Formula Ia, can include one of $R^1$-$R^4$ being a carboxylic acid containing heterohydrocarbyl pendent group. That is to say, that such one of $R^1$-$R^4$ is represented by the formula $R^5COOH$, where $R^5$ is a $C_1$ to $C_8$ alkyl divalent radical, such as, for example, —CH₂CH₂—, thus being the carboxylic acid containing pendent group —CH₂CH₂COOH. Carboxylic acid pendent groups are generally useful for participating in a reaction with appropriately selected additives, or other repeating units, that can lead either to the formation of an image for negative-tone embodiments or to fix a positive-tone image via post develop thermal crosslinking.

Such exemplary polymer embodiments can alternately, or additionally, encompass a distinct type of repeat unit having one of $R^1$-$R^4$ being a pendent hydrocarbyl group, not containing carboxylic acid functionality, having a dissociable hydrogen atom with a $pK_a$ less than 11. That is to say, that such one of $R^1$-$R^4$ is, for example, a pendent group having a structure in accordance with one of formula B:

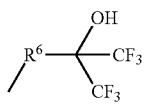

(B)

where $R^6$ is selected from —(CH₂)$_p$—, —(CH₂)$_q$—OCH₂— or —(CH₂)$_q$—(OCH₂CH₂)$_r$—OCH₂—, where p is an integer from 0 to 6, q is an integer from 0 to 4 and r is an integer from 0 to 3.

More specifically, some such embodiments that encompass a pendent group in accordance with formula B, have $R^6$ being the divalent radical —CH₂CH₂OCH₂—, such repeating unit can be named norbornenylethoxy-2-trifluoromethyl-3,3,3-trifluoropropan-2-ol (or norbornenyl ethoxymethylhexafluoropropanol, NBEMHFP). For some other such polymer embodiments $R^6$ of such second repeating unit is —CH₂OCH₂—, such repeating unit can be named norbornenylmethoxy 2-trifluoromethyl-3,3,3-trifluoropropan-2-ol (or norbornenyl methoxymethylhexafluoropropanol, NBMMHFP). For still other polymer embodiments, $R^6$ of such repeating unit is —CH₂—, and such repeat unit can be named norbornenyl-2-trifluoromethyl-3,3,3-trifluoropropan-2-ol (HFANB). Such alternate or additional distinct types of repeating units being useful for providing linear dissolution in aqueous base developers, as well as, in some cases, cross-linking.

Exemplary polymer embodiments in accordance with the present invention that exhibit cross-linking either to form an image or to fix an image can encompass one or more other distinct types of repeating units useful for cross-linking with one or both of previously described distinct repeating units useful for cross-linking. For example, repeat units having pendent groups in accordance with any of Formulae C, D, E and F:

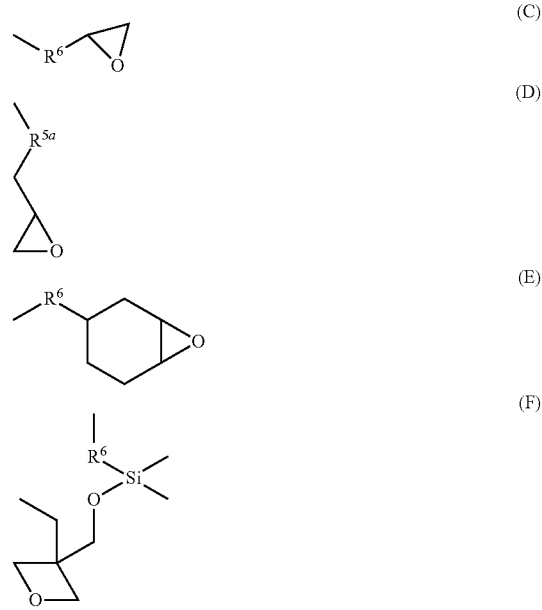

where $R^{5a}$, if present, is a —(CH₂)$_n$—O— radical where n is from 1 to 6 and $R^6$, if present, is a $C_1$ to $C_{12}$ alkyl moiety. As will be discussed below, repeat units containing a pendent group in accordance with Formulae C, D, E or F are generally useful for participating in reactions that are useful in cross-linking of such polymer compositions; repeat units containing a pendent group in accordance with Formula F are also generally useful for improving the adhesion of a film formed therefrom. It should be noted that non-polymeric cross-linking additives can be employed, in polymer composition embodiments of the present invention, as either an alternate to the aforementioned repeating units or in addition to such repeating units.

Some polymer embodiments in accordance with the present invention can include repeat units having a hindered phenol type pendent group, for example a pendent group in accordance with Formula G:

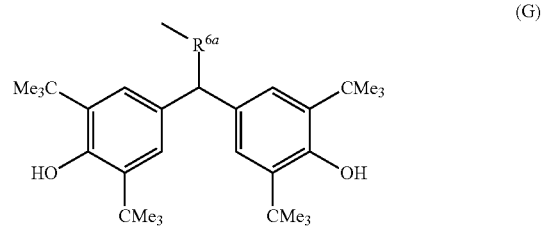

where $R^{6a}$, if present, is a $C_1$ to $C_4$ alkyl moiety.

While the polymer composition embodiments of the present invention have been described as encompassing a polymer having at least two distinct types of repeat units, such polymer compositions are not so limited. Thus some polymer composition embodiments can encompass a polymer having as many as three, four or five distinct repeating units, with the proviso that all such polymers encompassed by the polymer compositions of the present invention have a repeat unit that encompasses a pendent group represented by Formula A.

The polymer composition embodiments in accordance with the present invention also provide for stabilizing of short polyether pendent groups. It will be understood that where the thermo-oxidative stability of such pendent groups can be maintained in a film or structure made from such a polymer composition, the desirable characteristics of a repeat unit containing such a pendent group can be maintained.

Technical literature describes that polyethylene oxide based polymers will degrade rapidly in air at elevated temperature. While not wishing to be bound by theory, it is believed that hindered phenol type antioxidants interrupt the autocatalytic oxidation cycle by stabilizing the peroxide radical (III) (see, Scheme A) that is formed after oxidative degradation begins and was believed to be sufficient to prevent further oxidative degradation as indicated in Scheme A:

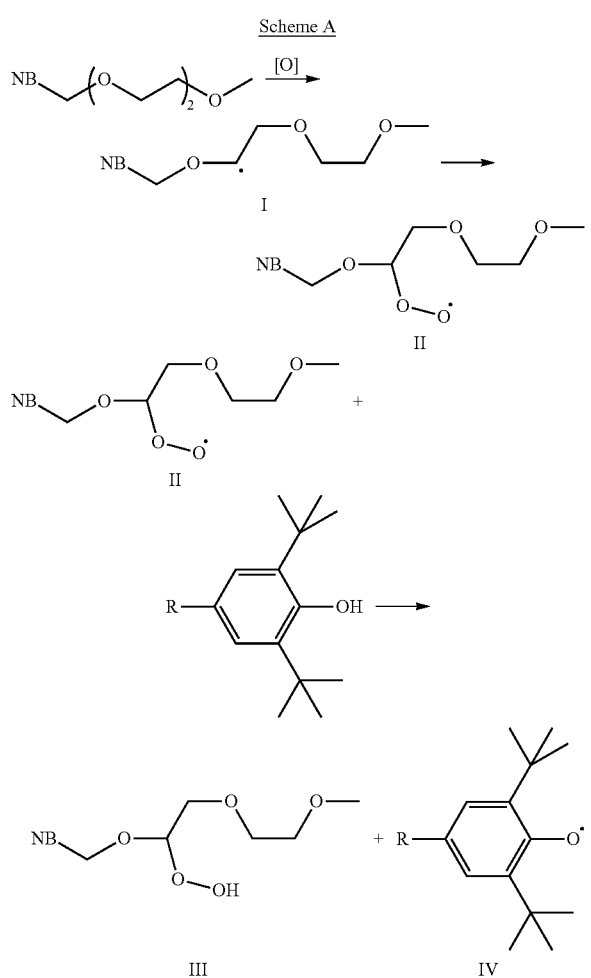

Therefore, to our surprise, incorporating a repeat unit derived from a monomer having a hindered phenol pendent group (shown by Formula G) such as AO2NB monomer (4,4'-(bicyclo[2.2.1]hept-5-en-2-ylmethylene)bis(2,6-di-tert-butylphenol) into a polymer embodiment of the present invention or including hindered phenol anti-oxidant additives, such as those mentioned in previously cited US Patent Application No. US 2011-0070543 A1, i.e., Irganox® 1076, Irganox 1010, or sulfur containing phenols, were not effective at preventing the rapid oxidative degradation of repeat units having a pendent group in accordance with Formula A, such as repeat units derived from a NBTON monomer. Rather, rapid thermo-oxidative degradation of the pendent group to form products V, VI, and VII, shown below in Scheme B, occurs. Further, while not wishing to be bound by theory, we believe that the continued fragmentation of a polyethylene oxide chain occurs even when a hydrogen peroxy group (III) has formed in the alpha position to an ether oxygen in a polyethylene oxide chain. In this instance, the "stabilized group" III which would be expected to be stable and not to continue a degradation process, thus it was found that III continues to act as a reactive chain breaking moiety, as indicated in the scheme below:

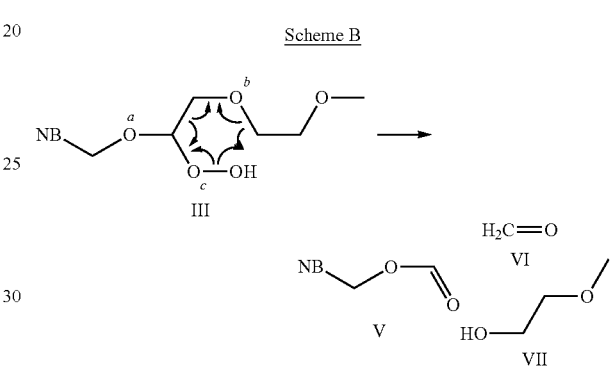

Therefore, alternate approaches for providing thermo-oxidative stability to the PNB polymer and composition embodiments of the present invention were developed as the result of careful study and experimental efforts. Thus it was found that improved oxidative stability can be achieved by employing a different AO additive strategy for polymer composition embodiments of the present invention. Specifically, such different AO additive strategy encompasses the use of diaryl amine compounds, e.g. Naugard 445, to inhibit the oxidative degradation. It was also found, as shown in Scheme C, that improved oxidative stability can be achieved by changing the number of methylene (—CH$_2$—) spacers between the poly (alkylene oxide) ether oxygen linkages, for example oxygen a and b, to prevent the unexpected, facile degradation of structure III as shown in Scheme B and it's analog VIII shown in Scheme C, below. Thus it is seen that the addition of an single extra methylene spacer between oxygen a and b of structure III, to form the analog structure VIII, would prevent the favorable alignment of the oxygen atoms into the 6-membered orientation shown in Scheme B and provide the unfavorable alignment shown in Scheme C. Thus preventing, or at least minimizing, the undesirable decomposition to products IX, X and XI shown in Scheme C, below:

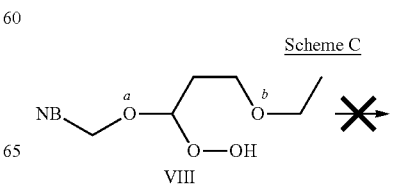

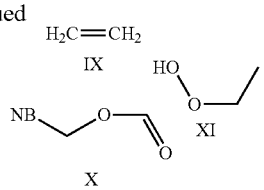

Referring now to FIG. 1, a chart showing the percent weight loss of a first polymer (P9) having a repeat unit derived from a NBTON monomer (NBEtCO$_2$H/HFANB/NBTON), and a second polymer (P14) having a repeat unit derived from a NB-3-MPM monomer (NBEtCO$_2$H/HFANB/NB-3-MPM), as each polymer was heated at 200° C. for 600 minutes is provided. As seen, polymer P14, having the repeat unit derived from a NB-3-MPM monomer, and thus having the additional methylene spacer as discussed above, shows considerably less weight loss than polymer P9. This result being supportive of the above discussion as to how oxidative degradation is likely occurring.

However, while the use of repeat units derived from monomers such as NB-3-MPM or NB-3-MBM (see, Examples M1 and M2, respectively), can be advantageous, the effect of non-polymeric additives was also explored. More specifically, since diaryl amine compounds, such as the aforementioned Naugard 445, (NG445) are known to be employed for main chain stabilization of polyethers, their effect on the stability of polymer formulation embodiments of the present invention was studied. To conduct this study, polymer formulation embodiments F18-F31 were thermogravimetrically tested by heating samples of each formulation isothermally, at 180° C. for 2 hours, in a nitrogen atmosphere. The results of this study are summarized in Table 7, below. While again not wishing to be bound by theory, it is believed that any observed weight loss is related, in significant part, to the degradation of the short side chain polyether pendent groups in the presence of a strong organic acid, which can be seen to be mitigated by the presence of the diaryl amine synergist NG445.

Figure 2:
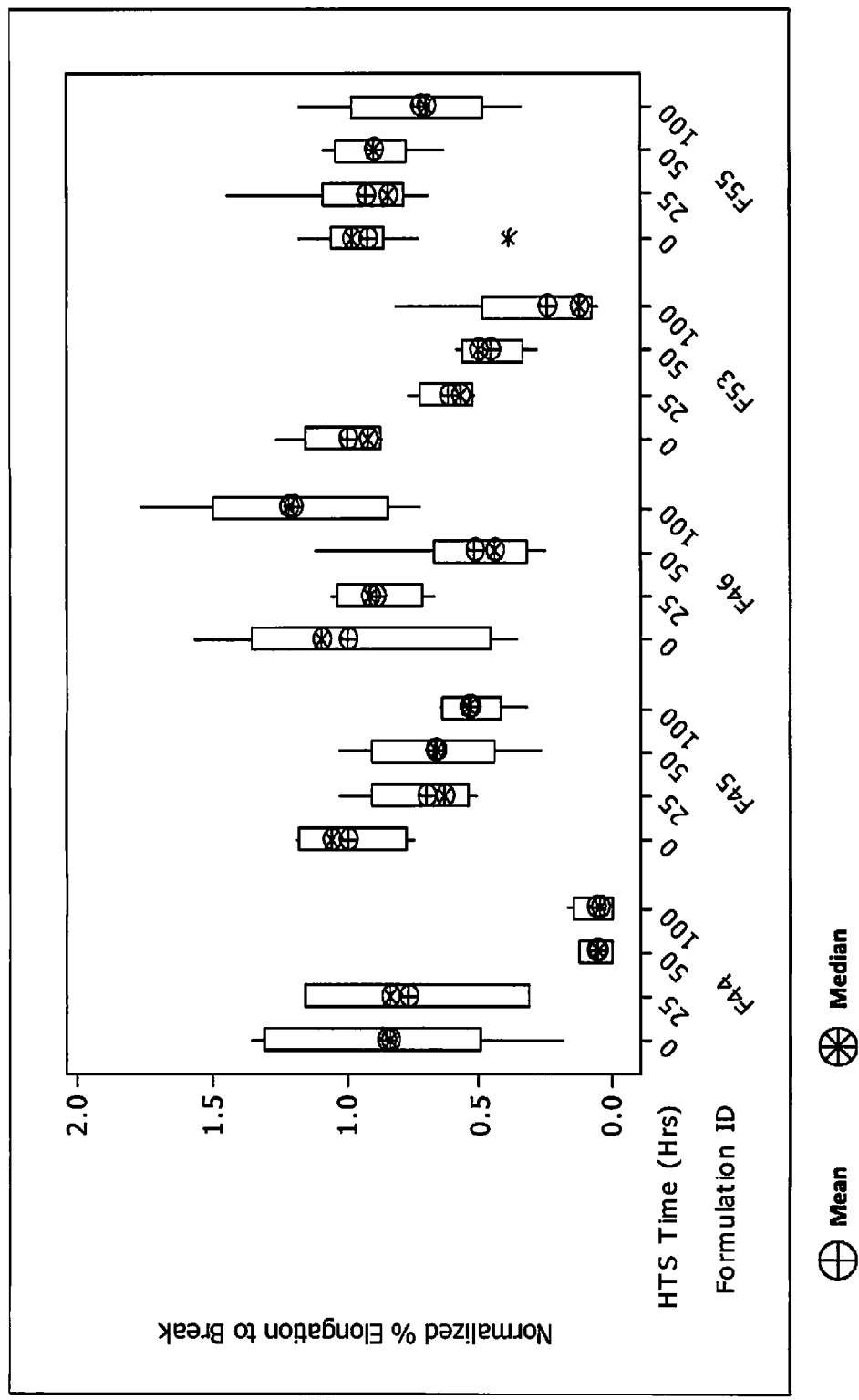
FIG. 2 is a box plot graph showing normalized elongation to break of Formulation embodiments F44, F45, F46, F53 and F55 during high temperature stability testing (HTS) at 150° C. in air for 100 hours.

Turning now to FIG. 2, a box plot graph is seen that compares the normalized elongation to break of Formulations F44, F45, F46, F53 and F55 obtained during an isothermal, high temperature stability testing (HTS) at 150° C., in air, for 100 hours. In this test, both the thermal and oxidative degradation of the formulations is evaluated by the heating in air as opposed to a nitrogen atmosphere. Further, as thermo-oxidative degradation is known to result in a polymer showing a reduction in its elongation to break, it is believed that any change in elongation to break of the polymers of formulations F44, F45, F46, F53 and F55 is indicative of thermo-oxidative degradation. It will be understood that each result depicted in the box plot graph shows a box that represents 50% of the measured data. The upper boundary of the box represents the third quartile boundary (75% of the data is less than this value), while the lower box boundary represents the first quartile boundary (25% of the data is less than this value). The line between the upper and lower box boundaries represents the second quartile boundary (50% of the data is less than this value) and the upper and lower vertical lines, whiskers, extend to the maximum data point within 1.5 box heights from the top and bottom of the box, respectively. It should be noted that each of Formulations F44, F45 and F46 encompass polymer P9 (HFANB/NBEtCOOH/NBTON), formulation F53 encompasses polymer P12 (HFANB/NBEtCOOH/NB-TON/AO2NB) and formulation F55 encompasses polymer P14 (HFANB/NBEtCOOH/NB-3-MPM). Therefore only formulation F55 has a repeat unit derived from NB-3-MPM which has an additional methylene spacer between the polyether oxygens of its pendent group. As for formulation F53, polymer P12 includes a repeat unit derived from an AO2NB monomer. That is to say, a monomer having a hindered phenol type pendent group. Thus F44, F53 and F55 do not have any antioxidant or synergist additives, while F45 has only the antioxidant additive and F46 has both the antioxidant and synergist additives (see, Table 11). Thus it can be seen from the box plot of FIG. 2 that F44 and F53 show the highest reduction in elongation to break, the worst results, while F46 and F55 show the best results, that is to say show the best thermo-oxidative stability of the five formulations presented in FIG. 2.

Figure 3:
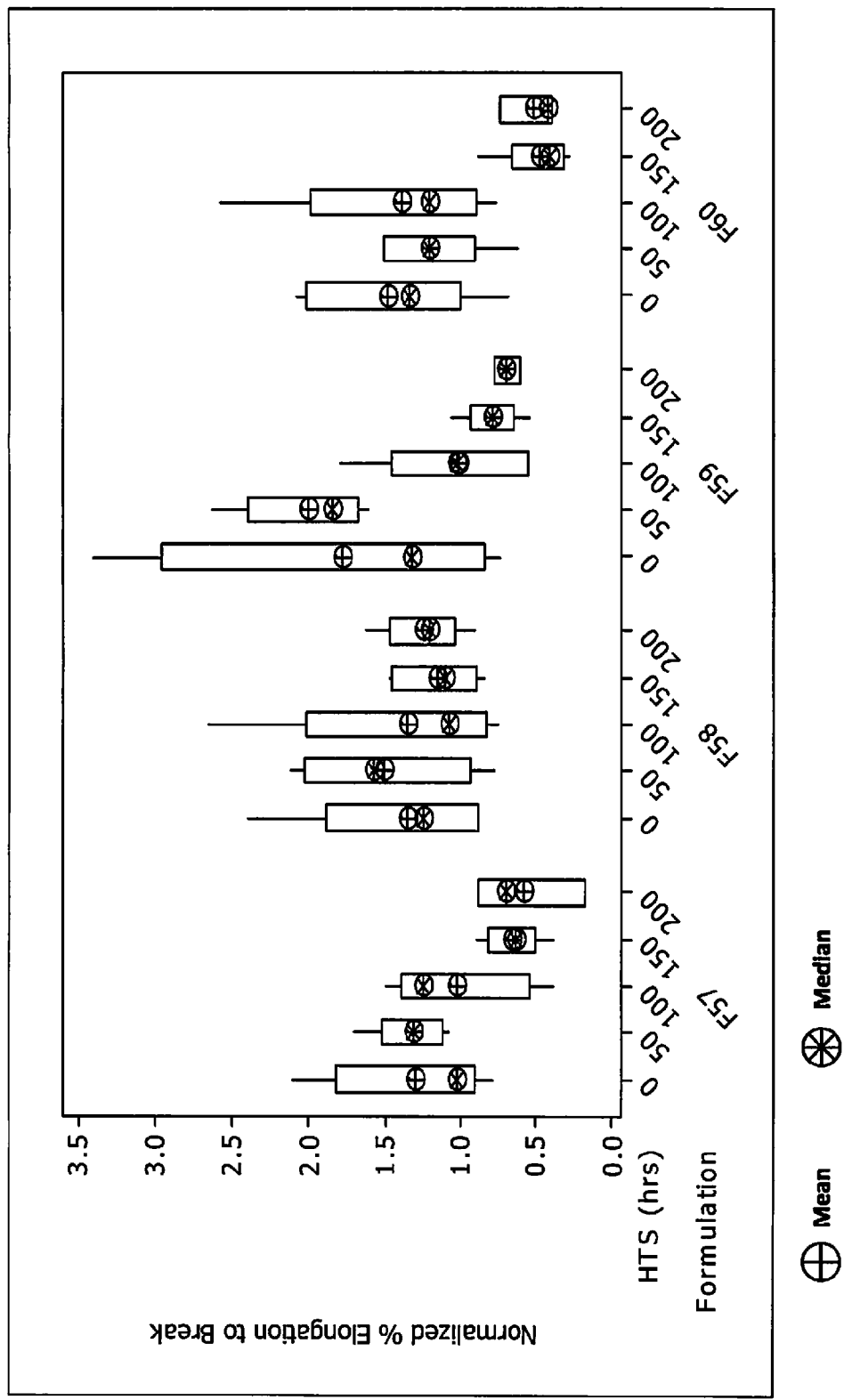
FIG. 3 is a box plot graph showing normalized elongation to break of Formulation embodiments F57-F60 measured during high temperature stability testing (HTS) at 150° C. in air for 200 hours.
Figure 4:
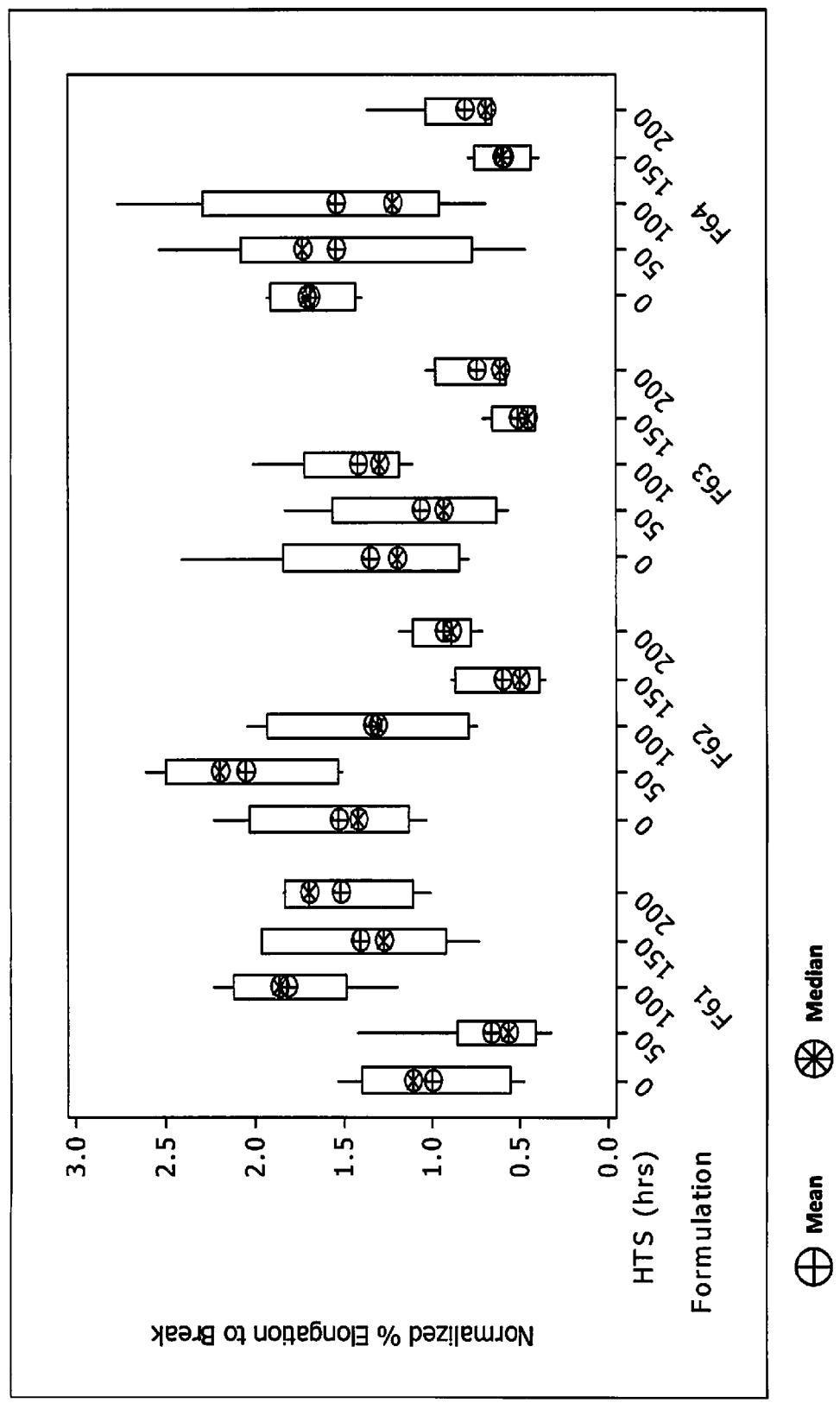
FIG. 4 is a box plot graph showing normalized elongation to break of Formulation embodiments F61-F64 measured during high temperature stability testing (HTS) at 150° C. in air for 200 hours.
Figure 5:
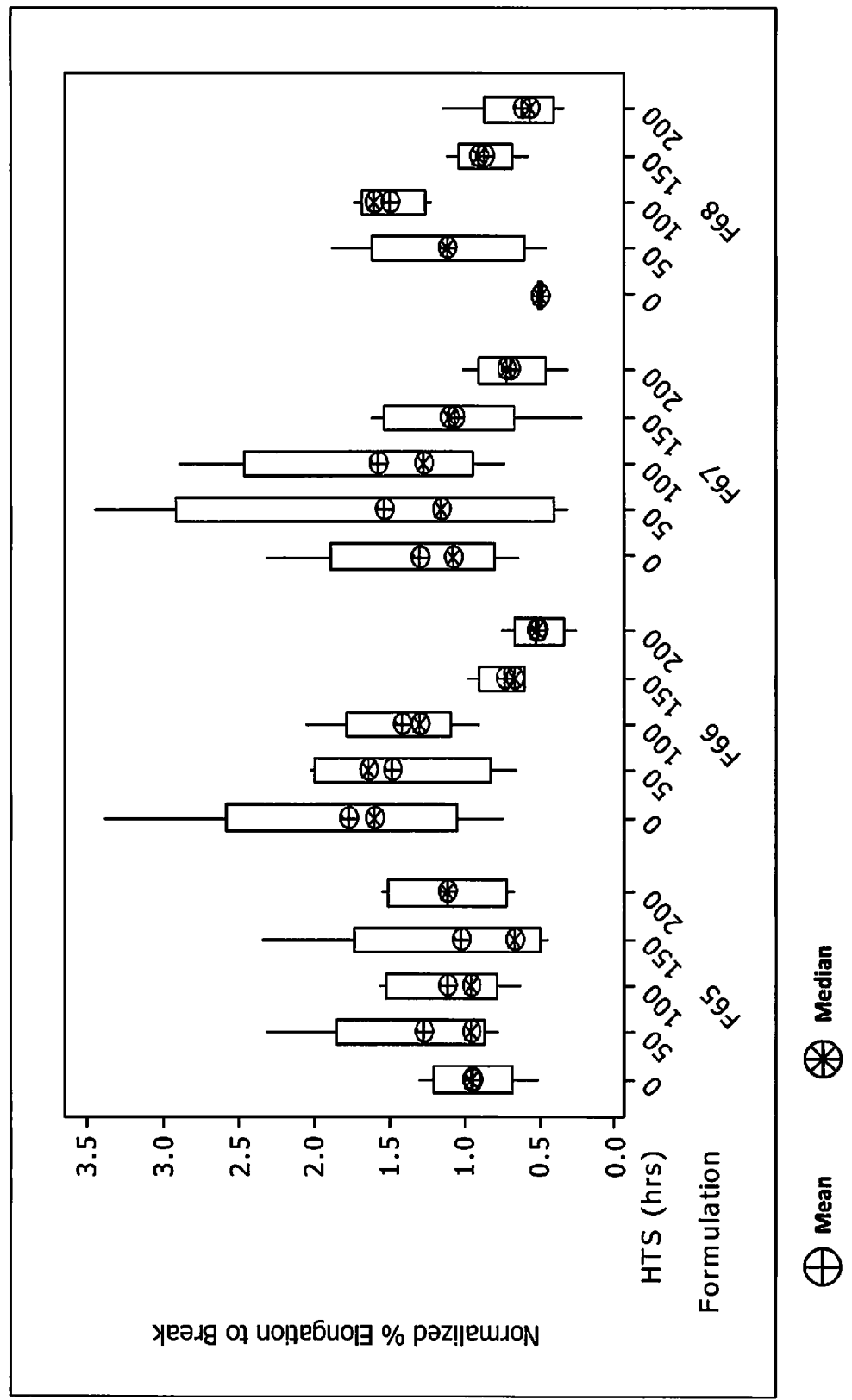
FIG. 5 is a box plot graph showing normalized elongation to break of Formulation embodiments F65-F68 measured during high temperature stability testing (HTS) at 150° C. in air for 200 hours.

Turning now to FIGS. 3, 4 and 5, a more exhaustive study of thermo-oxidative stability is provided. Collectively these three figures provide elongation to break data for twelve formulations (F57-F68) that where heated for 200 hours. Referring to Table 12, the full complement of additives included with polymer P9 (HFANB/NBEtCOOH/NBTON) for each formulation is provided. As it can be seen, formulations F58, F61 and F65 show the most stable elongation to break values.

Exemplary aromatic diamine compounds that act as antioxidant synergists or synergists or stabilizers include, but are not limited to, 4,4'-dimethyldiphenylamine (TCI America, Portland, Oreg.), 4,4'-dimethoxydiphenylamine (Thermoflex, E.I. du Pont Nemours & Co., Wilmington, Del.), N,N'-di-2-naphthyl-p-phenylenediamine (Agerite White, TCI America, Portland, Oreg.), di-tert-butyl-diphenylamine (Stearer Star, TCI America, Portland, Oreg.), 4,4'-bis($\alpha,\alpha$-dimethylbenzyl)diphenylamine (Naugard 445, Chemtura, Middlebury, Conn.), Irganox 5057 (BASF America, Florham Park N.J.), Irganox-57L (BASF America, Florham Park N.J.) and Wingstay 29 (Eliochem, Villejust, France). It has been found that in general, such materials are effective at loadings from 1 parts per hundred resin (pphr) polymer to 20 pphr polymer. However it should be understood that loadings higher or lower may also prove effective as their efficacy is dependent, at least in part, on the nature and loading of the phenolic material employed.

Exemplary phenolic compounds that can act as primary anti-oxidants include, among others, 2,2'-(2-hydroxy-5-methyl-1,3-phenylene)bis(methylene)bis(4-methylphenol) (Antioxidant-80) (TCI America, Portland, Oreg.), 6,6-methylenebis(2-(2-hydroxy-5-methylbenzyl)-4-methylphenol) (4-PC, DKSH, North America), 6,6'-(2-hydroxy-5-methyl-1,3-phenylene)bis(methylene)bis(2-(2-hydroxy-5-methylbenzyl)-4-methylphenol) (DKSH, North America), 6,6'-methylenebis(2-(2-hydroxy-3,5-dimethylbenzyl)-4-methylphenol) (DKSH, North America), 6,6'-(2-hydroxy-5-methyl-1,3-phenylene)bis(methylene)bis(2,4-dimethylphenol) (DKSH, North America), Lowinox® 22M46 (Chemtura, Middlebury, Conn.), Lowinox 221B46 (Chemtura, Middlebury, Conn.), Lowinox 44B25 (Chemtura, Middlebury, Conn.), Lowinox CA-22 (Chemtura, Middlebury, Conn.), Lowinox AH-25 (Chemtura, Middlebury, Conn.) and Lowinox-CPL (Chemtura, Middlebury, Conn.). It has been found that in general, such materials are effective at loadings from 1 pphr polymer to 20 pphr polymer. However it should be understood that loadings higher or lower may also prove effective as their efficacy is dependent, at least in part, on the nature and loading of the diaryl amine material employed.

Polymer formulation embodiments in accordance with the present invention can exhibit positive tone imageability or negative tone imageability. Where positive tone imageability is desired, it has been found that a photosensitive material can be incorporated into the composition. Such materials selected to provide positive tone imageability generally encompass a 1,2-naphthoquinonediazide-5-sulfonylic structure and/or a 1,2-naphthoquinonediazide-4-sulfonylic structure represented in structural Formulae (2a) and (2b), respectively:

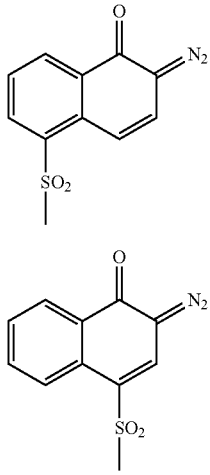

2a

2b and benzoquinone diazide materials as represented in structural Formula (2c):

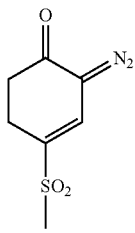

2c

Generally the structures of Formulae (2a), (2b) and/or (2c) are incorporated into the photosensitive composition as an esterification product of the respective sulfonyl chloride (or other reactive moiety) and a phenolic compound, such as one of structures 3a through 3f shown below, each generally referred to as a photoactive compound or PAC. Thus, any one, or any mixture of two or more of such PACs are combined with the polymer in forming a positive tone polymer composition embodiment of the present invention. In each of Formulae (3), Q represents any of the structures of Formulae 2a, 2b or 2c. Advantageously, when a portion of a film or a layer of the photosensitive composition is exposed to appropriate electromagnetic radiation, these esterification products generate a carboxylic acid which enhances the solubility of such exposed portion in an aqueous alkali solution as compared to any unexposed portions of such film. Generally such photosensitive materials are incorporated into the composition in an amount from 5 to 50 pphr polymer. Where the specific ratio of the photosensitive material to polymer is a function of the dissolution rate of exposed portions as compared to unexposed portions and the amount of radiation required to achieve a desired dissolution rate differential. Advantageous photosensitive materials useful in embodiments in accordance with the present invention are shown in Formulae 3a-3f below; additional useful photosensitive materials are exemplified in U.S. Pat. No. 7,524,594 B2 columns 14-20 and are incorporated herein by reference:

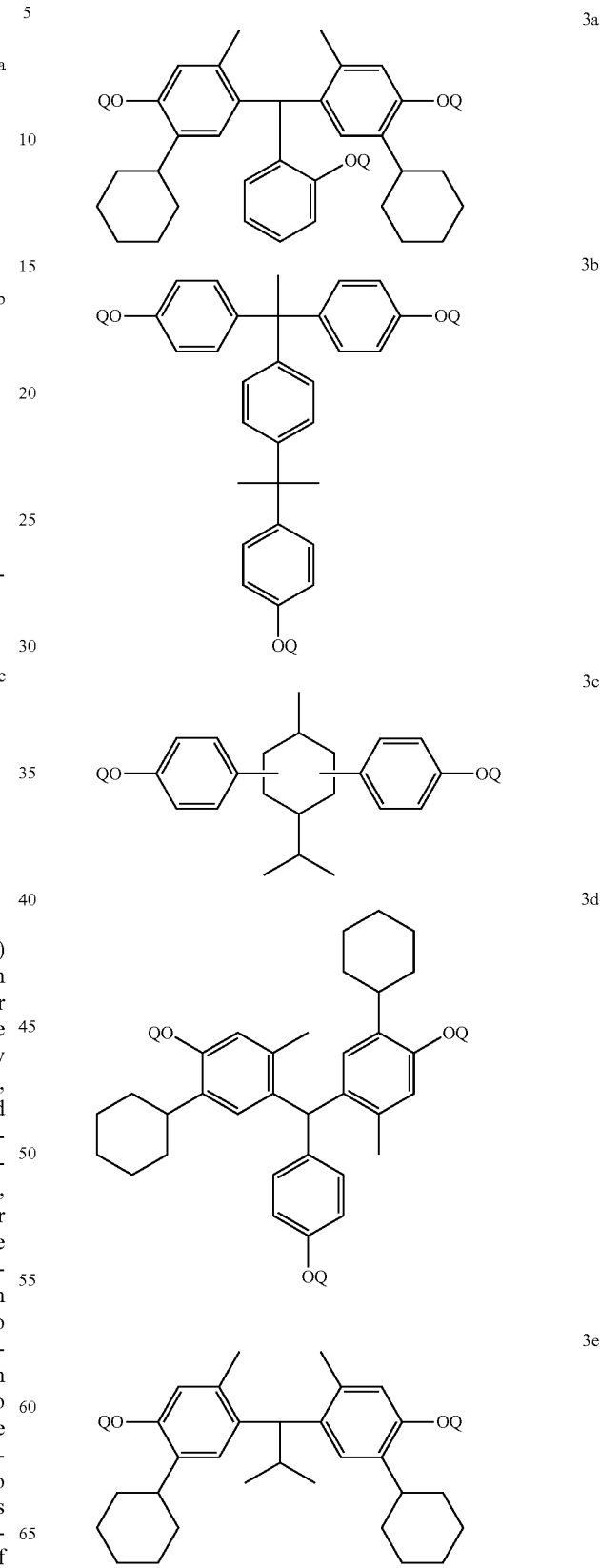

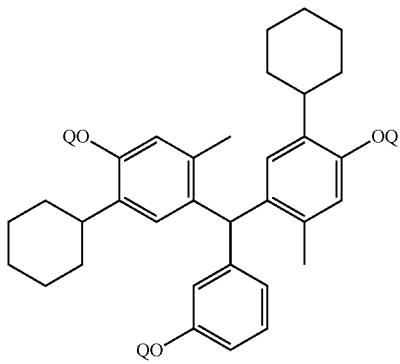

3f

Polymer composition embodiments of the present invention also include additives that are advantageously capable of bonding with the pendant acidic group of the resin. Such materials include, but are not limited to, additives that incorporate one or more epoxy groups such as a glycidyl group, a epoxycyclohexyl group, an oxetane group; an oxazoline group such as 2-oxazoline-2-yl group, a methylol group such as a N-hydroxy methylaminocarbonyl group or an alkoxymethyl group such as a N-methoxy methylaminocarbonyl group. Generally, the aforementioned bonding with the pendant acid group of the polymer is a cross-linking reaction that is initiated by heating to an appropriate temperature, generally above 110° C. for an appropriate amount of time.

Other exemplary cross-linking or crosslinkable materials that can be used as additives in the forming of a polymer composition embodiments of the present invention include, among others, bisphenol A epoxy resin, bisphenol F epoxy resin, silicone containing epoxy resins or the like, propylene glycol diglycidyl ether, polypropylene glycol diglycidyl ether, glycidyloxypropyltrimethoxysilane, polymethyl(glycidyloxypropyl)cyclohexane or the like; polymers containing oxazoline rings such as 2-methyl-2-oxazoline, 2-ethyl-2-oxazoline, 1,3-bis(2-oxazoline-2-yl)benzene, 1,4-bis(2-oxazoline-2-yl)benzene, 2,2'-bis(2-oxazoline), 2,6-bis(4-isopropyl-2-oxazoline-2-yl)pyridine, 2,6-bis(4-phenyl-2-oxazoline-2-yl)pyridine, 2,2'-isopropylidenebis(4-phenyl-2-oxazoline), (S,S)-(−)-2,2'-isopropylidenebis(4-tert-butyl-2-oxazoline), poly(2-propenyl-2-oxazoline) or the like; N-methylolacrylamide, N-methylol methacrylamide, furfuryl alcohol, benzyl alcohol, salicyl alcohol, 1,2-benzene dimethanol, 1,3-benzene dimethanol, 1,4-benzene dimethanol and resole type phenol resin or mixtures thereof. It has been found that, in general, such materials are effective at loadings from 5 pphr polymer to 40 pphr polymer. However it should be understood that loadings higher or lower may also prove effective as their efficacy is dependent, at least in part, on the nature of the polymer employed and its mole percent of repeat units encompassing crosslinkable pendent groups.

For ease of understanding and without limitation, the following exemplary structural representations of some additive materials useful in embodiments of the present invention are provided hereinbelow without limitation or restriction:

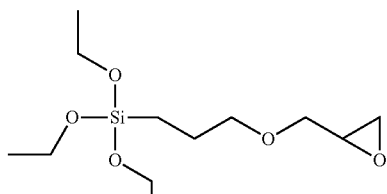

3-GTS (KBM-403E)
triethoxy(3-(oxiran-2-ylmethoxy)propyl)silane

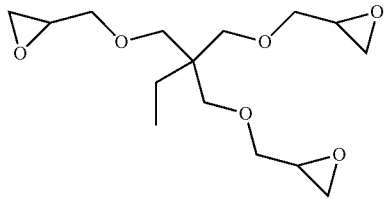

Denacol EX321L
2,2'-(((2-ethyl-2-((oxiran-2-ylmethoxy)methyl)propane-1,3-diyl)bis(oxy))bis(methylene))bis(oxirane)

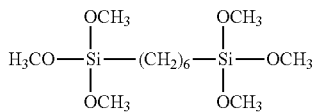

SIB-1832
3,3,10,10-tetramethoxy-2,11-dioxa-3,10-disiladodecane

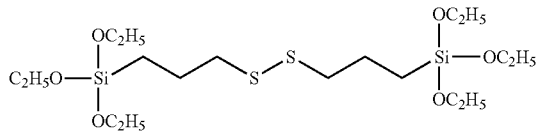

Si-75
4,4,13,13-tetraethoxy-3,14-dioxa-8,9-dithia-4,13-disilahexadecane

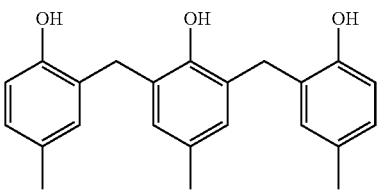

Antioxidant 80 (AO80)
2,2'-((2-hydroxy-5-methyl-1,3-phenylene)bis(methylene))bis(4-methylphenol)

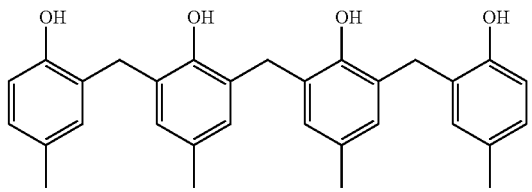

4-PC
6,6'-methylenebis(2-(2-hydroxy-5-methylbenzyl)-4-methylphenol)

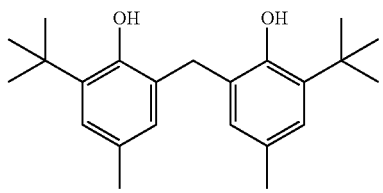

Lowinox 22M46
6,6'-methylenebis(2-(tert-butyl)-4-methylphenol)

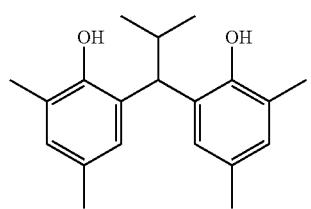

Lowinox 22IB46
6,6'-(2-methylpropane-1,1-diyl)bis(2,4-dimethylphenol)

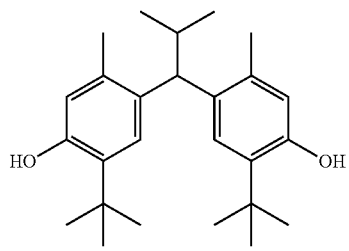

Lowinox 44B25
4,4'-(2-methylpropane-1,1-diyl)bis(2-(tert-butyl)-5-methylphenol)

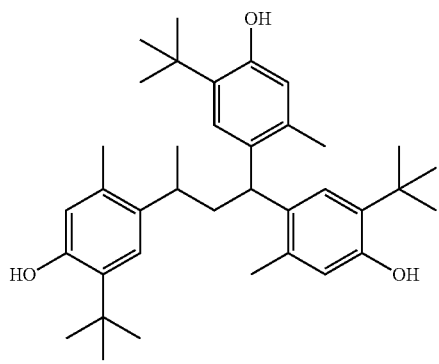

Lowinox CA-22
4,4',4''-(butane-1,1,3-triyl)tris(2-(tert-butyl)-5-methylphenol)

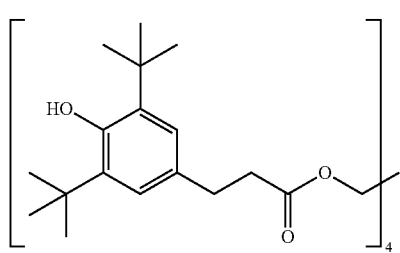

Irganox 1010
Pentaerythritol Tetrakis(3-(3,5-di-tert-butyl-4-hydroxyphenyl)propionate)

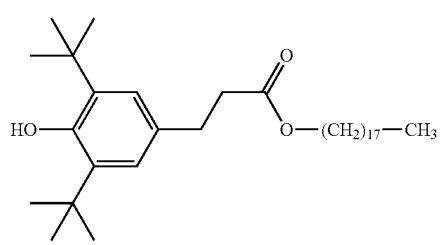

Irganox 1076
3,5-bis(1,1-dimethylethyl)-4-hydroxy-octadecyl ester
Benzenepropanoic acid

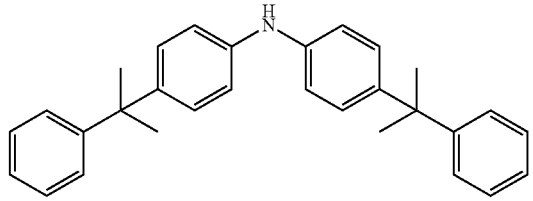

Naugard 445 (NG445)
bis(4-(2-phenylpropan-2-yl)phenyl)amine

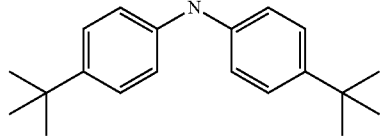

Steerer Star
bis(4-(tert-butyl)phenyl)amine

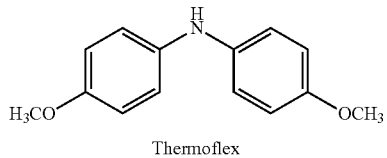

Thermoflex
bis(4-methoxyphenyl)amine

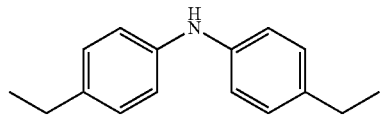

4,4'-diethyldiphenylamine
bis(4-ethylphenyl)amine

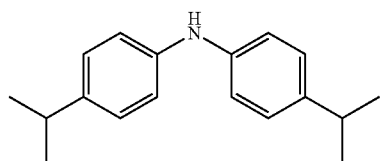

4,4'-diisopropyldiphenylamine
bis(4-isopropylphenyl)amine

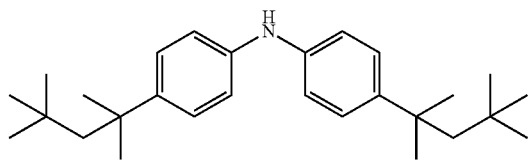

Irganox 5057
bis(4-(2,4,4-trimethylpentan-2-yl)phenyl)amine

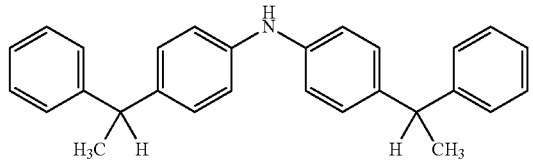

Wingstay 29
bis(4-(1-phenylethyl)phenyl)amine

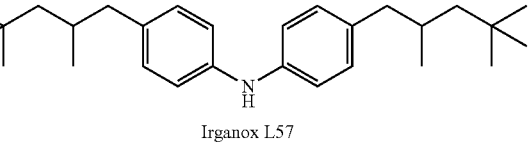

Irganox L57
bis(4-(2,4,4-trimethylpentyl)phenyl)amine

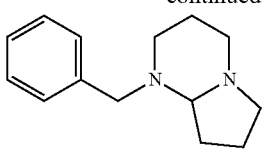

CGI-90
1-benzyloctahydropyrrolo[1,2-α]pyrimidine

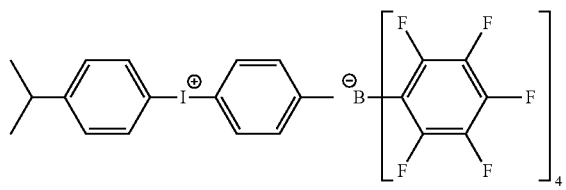

Rhodorsil PI 2074
tetrakis(2,3,4,5,6-pentafluorophenyl)borate(1-)
[4-(1-methylethyl)phenyl](4-methylphenyl)Iodonium

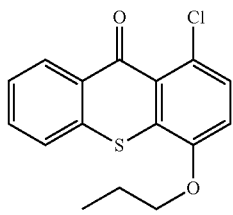

CPTX
1-chloro-4-propoxy-9H-Thioxanthen-9-one

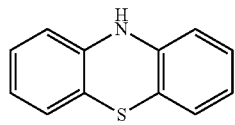

Phenothiazine
10H-Phenothiazine

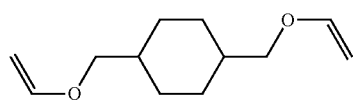

Cyclohexane Divinyl ether (CHDVE)
1,4-Bis[(ethenyloxy)methyl]-cyclohexane

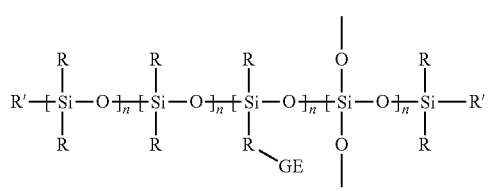

BY-16-115
where GE = glycidyl ether

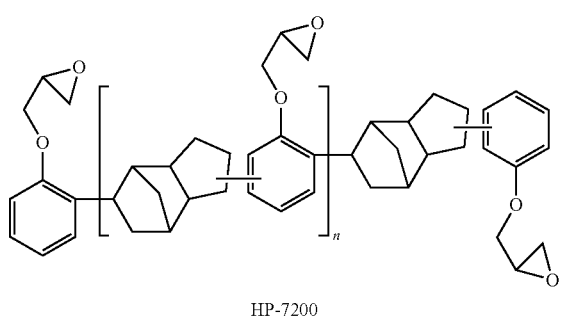

HP-7200

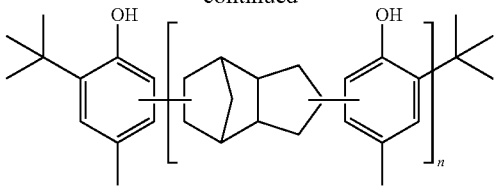

Lowinox CPL

Polymer composition embodiments in accordance with the present invention may also encompass other components as may be useful for the purpose of improving the properties of both the composition and the resulting polymer layer. For example the sensitivity of the composition to a desired wavelength of exposure radiation. Examples of such optional components include various additives such as dissolution promoters, surfactants, silane coupling agents and leveling agents.

To form polymer composition, or formulation embodiments of the present invention, the desired polymer and appropriate additives, as described above, are dissolved in a solvent to form a solution suitable for forming a film overlying a substrate. Useful solvents include, among others, N-methyl-2-pyrrolidone, y-butyrolactone, N,N-dimethylacetamide, dimethylsulfoxide, diethyleneglycol dimethylether, diethyleneglycol diethylether, diethyleneglycol dibutylether, propyleneglycol monomethylether, dipropylene glycol monomethylether, propyleneglycol monomethylether acetate, methyl lactate, ethyl lactate, butyl lactate, methylethyl ketone, cyclohexanone, tetrahydrofuran, methyl-1,3-butyleneglycolacetate, 1,3-butyleneglycol-3-monomethylether, methyl pyruvate, ethyl pyruvate, methyl-3-methoxypropionate or mixtures thereof.

The photosensitive polymer composition embodiments, in accordance with the present invention, are first applied to a desired substrate to form a film. Such a substrate includes any appropriate substrate as is, or may be used for electrical, electronic or optoelectronic devices, for example, a semiconductor substrate, a ceramic substrate, a glass substrate. With regard to said application, any appropriate coating method can be employed, for example spin-coating, spraying, doctor blading, meniscus coating, ink jet coating and slot coating.

Next, the coated substrate is heated to facilitate the removal of residual casting solvent, for example to a temperature from 70° C. to 130° C. for from 1 to 30 minutes, although other appropriate temperatures and times can be used. After the heating, the film is generally imagewise exposed to an appropriate wavelength of actinic radiation, wavelength is generally selected based on the choice of the photoactive compound and/or photosensitizer incorporated into the polymer composition. However, generally such appropriate wavelength is from 200 to 700 nm. It will be understood that the phrase "imagewise exposure" means exposing through a masking element to provide for a resulting pattern of exposed and unexposed portion of the film.

After an imagewise exposure of the film formed from polymer composition, or formulation, embodiments in accordance with the present invention, a development process is employed. For the positive tone polymer formulations of the present invention, such development process removes only exposed portions of the film thus leaving a positive image of the masking layer in the film. For the negative tone polymer formulations of the present invention, such development process removes only unexposed portions of the film thus leaving a negative image of the masking layer in the film. For some embodiments, a post exposure bake can be employed prior to the aforementioned development process.

Suitable developers, can include aqueous solutions of inorganic alkalis such as sodium hydroxide, potassium hydroxide, sodium carbonate, ammonia water and aqueous solutions of organic alkalis such as 0.26N tetramethylammonium hydroxide (TMAH), ethylamine, triethylamine and triethanolamine. Where an organic alkali is used, generally an organic solvent essentially fully miscible with water is used to provide adequate solubility for the organic alkali. Aqueous solutions of TMAH are well known developer solutions in the semiconductor industry. Suitable developers can also include organic solvents such as PGMEA, 2-heptanone, cyclohexanone, toluene, xylene, ethyl benzene, mesitylene and butyl acetate, among others.

Thus some formulation embodiments of the present invention provide self-imagable films that after imagewise exposure a resulting image is developed using an aqueous base solution, while for other such embodiments a resulting image is developed using an organic solvent. Regardless of which type of developer is employed, after the image is developed, the substrate is rinsed to remove excess developer solution, typical rinse agents are water or appropriate alcohols and mixtures thereof.

After the aforementioned rinsing, the substrate is dried and the imaged film finally cured. That is to say, the image is fixed. Where the remaining layer has not been exposed during the imagewise exposure, image fixing is generally accomplished by causing a reaction within the remaining portions of the film. Such reaction is generally a cross-linking reaction that can be initiated by heating and/or non-imagewise or blanket exposure of the remaining material. Such exposure and heating can be in separate steps or combined as is found appropriate for the specific use of the imaged film. The blanket exposure is generally performed using the same energy source as employed in the imagewise exposure although any appropriate energy source can be employed. The heating is generally carried out at a temperature from above 110° C. for a time of from several minutes to one or more hours. Where the remaining layer has been exposed during the imagewise exposure, image fixing is generally accomplished by a heating step to tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

The devices are produced by using embodiments of the alkali soluble photosensitive resin composition of the present invention to form layers which are characterized as having high heat resistance, an appropriate water absorption rate, high transparency, and low permittivity. In addition, such layers generally have an advantageous coefficient of elasticity after curing, 0.1 kg/mm$^2$ to 200 kg/mm$^2$ being typical.

Embodiments in accordance with the present invention advantageously have a low modulus. Thus some embodiments of cured polymers, films, layers or structures in accordance with the present invention have a modulus less than 3.0 GPa and as low as 0.3 GPa, others as low as 0.2 GPa, and still others as low as 0.1 GPa. As a skilled artisan knows, if the modulus is too high, such a high modulus film will generally also have high internal stress which can lead to reliability issues, e.g., die cracking or warpage in an electronics package.

As previously mentioned, exemplary applications for embodiments of the photosensitive resin compositions in accordance with the present invention include die attach adhesive, wafer bonding adhesive, insulation films (interlayer dielectric layers), protecting films (passivation layers), mechanical buffer films (stress buffer layers) or flattening films for a variety of semiconductor devices, printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Upon using the photosensitive resin composition of the invention for these applications, the coefficient of elasticity of the resin composition after curing is generally from 0.1 kg/mm$^2$ to 200 kg/mm$^2$, and often from 0.1 kg/mm$^2$ to 100 kg/mm$^2$. Further, in such semiconductor applications, a thickness of the layer of the photosensitive resin composition after curing is generally from 0.1 μm to 200 μm, and often from 0.1 μm to 100 μm.

Embodiments in accordance with the present invention therefore provide a positive tone photosensitive polymer composition which exhibits enhanced characteristics with respect to one or more of mechanical properties (such as low-stress retained elongation to break after aging) and at least equivalent chemical resistance, as compared to alternate materials. In addition such embodiments provide generally excellent electrical insulation, adhesion to the substrate, and the like. Thus semiconductor devices, device packages, and display devices are provided that incorporate embodiments in accordance with the present invention.

EXAMPLES

Some of the following examples provide descriptions of polymerizations of monomers that are useful for forming the polymer composition embodiments of the present invention. It should be noted that while such examples may be used to prepare the polymers employed in the embodiments of the present invention, they are presented only for illustrative purposes and therefore are not limiting. Other examples presented herein relate to characteristics of the polymer and polymer composition embodiments of the present invention. Such characteristics are of interest for enabling polymer design embodiments of the present invention as well as for demonstrating that such polymer and polymer composition embodiments are useful.

Common to all polymerization examples that follow is that the reagents used are essentially moisture and oxygen free (typically <10 ppm oxygen and <5 ppm H$_2$O). That is to say, that both the reagents and solvents are charged into a reaction vessel and then sparged with nitrogen for a period of time believed sufficient to remove essentially all dissolved oxygen, or the reagents and solvents are individually sparged prior to their use and stored under a nitrogen blanket prior to being charged to the reaction vessel. Therefore, it will be understood that while a specific experimental description will not refer to either of the above methods of providing oxygen free reagents and solvents, one or the other was performed. Further, while not specifically mentioned in every example, an appropriate method of stirring or otherwise agitating the contents of a reaction vessel was provided.

As used in the polymerization examples and throughout the specification, ratios of monomer to catalyst, and cocatalyst if present, are molar ratios. Further, a number of acronyms or abbreviations are used in the examples. To aid in the understanding of these examples and to simplify their presentation herein below, the following listing of such acronyms or abbreviations with their full meaning is provided in Tables 1A and 1B:

TABLE 1A

Additives

3-GTS (KBM-403E): (3-glycidyloxypropyl)trimethoxy silane [CAS: 2530-83-8]
CGI-90: Octahydro-1-(phenylmethyl)-pyrrolo[1,2-a]pyrimidine [515145-31-0]
Denacol EX321L: 2,2'-(((2-ethyl-2-((oxiran-2-ylmethoxy)methyl)propane-1,3-diyl)bis(oxy))bis(methylene))bis(oxirane)
SIB-1832: 3,3,10,10-tetramethoxy-2,11-dioxa-3,10-disiladodecane
CPTX: 1-chloro-4-propoxy-9H-Thioxanthen-9-o
Phenothiazine: 10H-Phenothiazine
CHDVE: 1,4-Bis[(ethenyloxy)methyl]-cyclohexane
Si-75: 4,4,13,13-tetraethoxy-3,14-dioxa-8,9-dithia-4,13-disilahexadecane
Antioxidant 80 (AO80): 2,2'-((2-hydroxy-5-methyl-1,3-phenylene)bis(methylene))bis(4-methylphenol)
4-PC: [2,2'-methylenebis[6-[(2-hydroxy-5-methylphenyl)methyl]-4-methyl-phenol
Lowinox 22M46: 6,6'-methylenebis(2-(tert-butyl)-4-methylphenol)
Lowinox 22IB46: 6,6'-(2-methylpropane-1,1-diyl)bis(2,4-dimethylphenol)
Lowinox 44B25: 4,4'-(2-methylpropane-1,1-diyl)bis(2-(tert-butyl)-5-methylphenol)
Lowinox CA22: 4,4',4''-(butane-1,1,3-triyl)tris(2-(tert-butyl)-5-methylphenol)
Irganox 1010: Pentaerythritol Tetrakis(3-(3,5-di-tert-butyl-4-hydroxyphenyl)propionate)
Naugard 445 (NG445): bis(4-(2-phenylpropan-2-yl)phenyl)amine
Steerer Star: bis(4-(tert-butyl)phenyl)amine
Thermoflex: bis(4-methoxyphenyl)amine
Irganox 5057: bis(4-(2,4,4-trimethylpentan-2-yl)phenyl)amine
Irganox L57: bis(4-(2,4,4-trimethylpentyl)phenyl)amine
Wingstay 29:: bis(4-(1-phenylethyl)phenyl)amine
TrisP-3M6C-2(5)-201: Structure 3a where 66% of Q is Structure 2a, the rest H
TrisP-3M6C-2(4)-201: Structure 3a where 66% of Q is Structure 2b, the rest H
Rhodorsil PI 2074: tetrakis(2,3,4,5,6-pentafluorophenyl)borate(1-)[4-(1-methylethyl)phenyl](4-methylphenyl)-Iodonium

TABLE 1B

Monomers

| | |
|---|---|
| HFANB | 2-(bicyclo[2.2.1]hept-5-en-2-ylmethyl)-1,1,1,3,3,3-hexafluoropropan-2-ol |
| TFSNB | N-(bicyclo [2.2.1]hept-5-en-2-ylmethyl)-1,1,1-trifluoromethanesulfonamide |
| NB | norbornene |
| TESNB | (bicyclo[2.2.1]hept-5-en-2-ylmethyl)triethoxysilane |
| MGENB | 2-((bicyclo[2.2.1]hept-5-en-2-ylmethoxy)methyl)oxirane |
| Acid NB | bicyclo[2.2.1]hept-5-ene-2-carboxylic acid |
| DecNB | 5-decylbicyclo[2.2.1]hept-2-ene |
| PENB | 5-phenethylbicyclo[2.2.1]hept-2-ene |
| PBNB | 5-phenbutylbicyclo[2.2.1]hept-2-ene |
| BuNB | 5-butylbicyclo[2.2.1]hept-2-ene |
| EONB | 2-(6-(bicyclo[2.2.1]hept-5-en-2-yl)hexyl)oxirane |
| NBCOOTMS | trimethylsilyl bicyclo[2.2.1]hept-5-ene-2-carboxylate |
| EPEsNB | ethyl 3-(bicyclo[2.2.1]hept-2-en-2-yl)propanoate |
| EPANB | 3-(bicyclo[2.2.1]hept-2-en-2-yl)propanoic acid |
| AO2NB | 4,4'-(bicyclo[2.2.1]hept-5-en-2-ylmethylene)bis(2,6-di-tert-butylphenol |
| NBMGlyHFP | 2-(2-(bicyclo[2.2.1]hept-5-en-2-yloxy)ethoxy)-1,1,1,3,3,3-hexafluoropropan-2-ol |
| NB-3-MPM | 5-(3-methoxypropanoxy)methyl-2-norbornene |
| NB-3-MBM | 5-(3-methoxypropanoxy)ethyl-2-norbornene |
| NBTON | 5-((2-(2-methoxyethoxy)ethoxy)methyl)bicyclo[2.2.1]hept-2-ene |
| NBTODD | 1-(bicyclo[2.2.1]hept-5-en-2-yl)-2,5,8,11-tetraoxadodecane |
| NBEMHFP | norbornenyl ethoxymethylhexafluoropropanol |
| NBMMHFP | norbornenyl methoxymethylhexafluoropropanol |

MONOMER SYNTHESIS EXAMPLES

Example M1

Preparation of 5-(3-methoxypropanoxy)methyl-2-norbornene (NB-3-MPM)

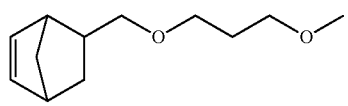

An appropriately sized and equipped reaction vessel was flushed with dry nitrogen for 1 hour before use and then charged with toluene sulfonyl chloride (TsCl) (159.3 g, 0.84 mol) and THF (370 ml, 291.4 g) to form a reaction mixture. Two aliquots of a mixture of sodium-t-pentoxide (306.8 g at 30% in THF) and 3-methoxy-1-propanol (53 g 0.59 mol) were added, drop wise, sequentially to the reaction mixture. When the temperature reached 45° C. the reaction mixture was cooled with a water bath in order to maintain the temperature in the range of 25° C. to 45° C. until the drop wise addition was complete. The chilling was then stopped and the reaction mixture was stirred for an additional 1 hour, at 35° C.

Norbornene methanol (NBCH$_2$OH, 131.8 g 1.06 mol) was combined with a second portion of sodium-t-pentoxide (306.8 g at 30% in THF) and added to the reaction mixture. The reaction mixture was then heated to 45° C. and stirred for 18.5 hours after which time heating was stopped. Next, 350 ml of water was added to the reaction mixture and the resultant mixture stirred for an additional 1.5 hours. The resulting monomer, 86.47 g (54.0%) yield, was isolated after several washings and vacuum distillation.

Example M2

Preparation of 5-(3-methoxypropanoxy)ethyl-2-norbornene (NB-3-MBM)

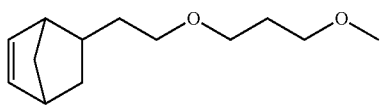

An appropriately sized and equipped reaction vessel was flushed with dry nitrogen for 1 hour before use and then charged with toluene sulfonyl chloride (111.1 g, 0.58 mol) and THF (824 ml, 732 g). A mixture of sodium-t-pentoxide (76.4 g, 0.69 mol), THF (200 ml, 178.2 g) and 3-methoxy-1-propanol (53 g, 0.59 mol) was added drop wise to the reaction mixture while monitoring the mixture's temperature. When the temperature reached 45° C. the reaction mixture was chilled to maintain the temperature in the range of 25° C. to 45° C. until the drop wise addition was complete. The ice bath was removed and the reaction was allowed to stir without heating or cooling for an additional 1 hour after which 53 ml of p-xylene was added and the mixture allowed to stir for an additional 10 min.

Norbornene ethanol (NBCH$_2$CH$_2$OH, 76.68 g 0.56 mol) was combined with a second portion of sodium-t-pentoxide (306.8 g at 30% in THF) and added to the reaction mixture. The reaction mixture was then heated to 50° C. and stirred for 18.5 hours after which heating was stopped. Next, 250 ml of water were added to the reaction mixture and the resultant mixture was stirred for 1.5 hours. The resulting monomer, 75 g, 64.3% yield, was isolated after several washings and vacuum distillation.

POLYMERIZATION EXAMPLES

Example P1

70/30 NBTON/MGENB

An appropriate sized reaction vessel was dried and purged with N$_2$ to minimize air and water contamination. The vessel was then charged with: 1,189.1 g of Toluene, 65.6 g of MEK, 245.6 g of NBTON (1.09 moles) and 83.8 g of MGENB (0.47 moles). The reaction medium was purged of oxygen by passing a stream of dry N$_2$ through the solution for 30 minutes while heating to 45° C. After the purge was complete, 6.26 g (0.013 mol) of (toluene)bis(pentafluorophenyl)nickel (NiArf) dissolved in 56.4 g of toluene was injected into the reaction vessel. The reactor temperature was increased to 60° C. at a rate of 1° C. per minute and the reaction mixture was stirred for three hours.

The polymerization reaction was terminated by the addition of 5 g water to the reaction mixture. Unreacted monomer was removed by extracting the reaction solution with two solvent washes comprising a mixture of ultrapure water (10 g), methanol (49 g) and heptanes (1647 g). After each solvent extraction, the mixing was stopped, the resulting phases were allowed to separate and the top phase was decanted. The solvent composition of the polymer phase was kept constant in each of the solvent extractions. The polymer was dissolved in 1086.8 g of 1,3-dioxolane. Two acidifications followed consisting of 231.4 g 30% hydrogen peroxide, 123 g acetic acid, and 1482 g water. Each acidification was run for 30 minutes at 50° C. After each acidification the mixing was stopped, the solution allowed to separate, and the bottom phase is decanted. Again solvent ratios were kept constant in each of the acidifications. The last acidification was followed by 3 water washes consisting of 329.3 g methanol and 1811.3 g ultra pure (UP) water. The water washes were mixed for 15 minutes at 50° C. After each waster wash, the mixing was stopped, the solution allowed to separate, and the bottom phase is decanted. 345.8 g of THF were added to the second and third water wash it assist the separation. Finally the polymer was diluted in MAK the residual solvents were stripped on a rotovap.

The above procedure was repeated twice to form the polymers of Examples P2 and P3 and used as a template for the formation of Examples P4-P8. The composition of each of Examples P1-P8, the % conversion and final M$_w$ and PDI are provided in Table 2, below:

TABLE 2

Data for Solvent Develop Polymer Compositions

| Ex. # | COMPOSITION | % Conversion | Mw | PDI |
|---|---|---|---|---|
| P1 | 70/30 NBTON/MGENB | 96.5% | 67,600 | 1.88 |
| P2 | 80/20 NBTON/MGENB | 96.9% | 72,000 | 2.12 |
| P3 | 90/10 NBTON/MGENB | 95.7% | 66,500 | 1.72 |
| P4 | 50/20/30 NBTON/PENB/MGENB | 99.6% | 73,800 | 1.89 |
| P5 | 20/50/30 NBTON/DecNB/MGENB | 98.0% | 78,000 | 2.47 |
| P6 | 40/30/30 NBTON/DecNB/MGENB | 90.9% | 66,500 | 1.95 |
| P7 | 80/20 NBTON/EONB | 67.0% | 64,100 | 1.65 |
| P8 | 30/40/30 NBTODD/PENB/MGENB | 98.3% | 90,800 | 1.95 |

Examples P9-P12

45/15/40 HFANB/NBEtCOOH/NBTON: Polymer

Example P9

A polymer encompassing repeat units derived from HFANB, EPEsNB and NBTON was prepared as follows: An appropriate sized reaction vessel was dried and purged with N$_2$ to minimize air and water contamination. The vessel was then charged with: toluene (992 g), DME (116 g), HFANB (148 g, 0.54 mol), EPEsNB (20.7 g, 0.11 mol) and NBTON (61.9 g, 0.27 mol). The reaction medium was purged of oxygen by passing a stream of dry N$_2$ through the solution for 30 minutes while heating to 45° C. In a separate vessel, additional EPEsNB (14.2 g, 0.073 mol) and NBTON (46.7 g, 0.16 mol), for metering into the reaction vessel, were combined and purged with N$_2$. After the purging was completed, 5.82 g (0.012 mol) of bis(toluene)bis(perfluorophenyl)nickel (NiArf) dissolved in 60.5 ml of toluene was injected into the reaction vessel containing all three monomers. Simultaneously, the metered feed portion of the monomers was added at a rate intended to keep unreacted monomers at a constant level for the duration of the polymerization (3 h).

Any unreacted monomers were removed and the resulting polymer dissolved in methanol/THF (approximately 1 L total volume in a 4/5 ratio). The ester functionality was hydrolyzed using NaOH solution at a ratio of 4.8/1 NaOH/NaOAc for 4 hours at 60° C. Two acidifications followed consisting of 405 g methanol, 196 g THF, 87 g acetic acid, 67 g formic acid, and 21 g water. Each acidification was run for 15 minutes at 50° C. After each acidification the mixing was stopped and the solution allowed to separate, and the top phase is decanted. This is followed by three water washes consisting of 390 g methanol and 2376 g water for ~15 minutes at 60° C. The solvent ratios were kept constant in each of the water washes. Finally the polymer was diluted in its final solvent and sent for solvent exchange. Conversion: 93.1%; $M_w$=85,900, PD=2.52.

Polymer Examples P10-P14 were prepared using the method of Polymer Example P9 as a template. Specific polymerization details are presented in the Table 3, below, where monomers A, B, C, D, E and F are HFANB, EPEsNB, NBCOOTMS, NBTON, NB-3-MPM and AO2NB, respectively. It should be noted that as described above the ester functionality of the repeat units derived from ester containing EPEsNB monomer are hydrolyzed such that the final polymer only has an acid functionality. $M_w$ is presented in atomic mass units (amu).

TABLE 3

Data for Aqueous Base Develop Polymers P9-P14

| Polymer | Polymer Composition (mol %) | | | | | | Conversion (%) | $M_w$ (amu.) | PDI |
|---|---|---|---|---|---|---|---|---|---|
| | A | B | C | D | E | F | | | |
| P9 | 46 | 15 | | 39 | | | 93.1 | 85.9 K | 2.52 |
| P10 | 39 | 13 | | 48 | | | 86.0 | 67.4 K | 2.52 |
| P11 | 25 | 25 | | 50 | | | 91.2 | 75.6 K | 1.74 |
| P12 | 54 | 14 | | 30 | | 2 | 89.0 | 76.9 K | 1.86 |
| P13 | 30 | | 20 | 50 | | | 70% | 57.4 K | 1.87 |
| P14 | 45 | 15 | | | 40 | | 92% | 102 K | 2.03 |

FORMULATION EXAMPLES

CIS/RDL Formulations

The following formulations are appropriate for polymers P1-P8 in Table 2.

Examples F1-F8

A series of 55 wt % solutions (F1-F8, shown in Table 4, below) of polymer P2 in MAK (F1) or PGMEA (F2-F8) having the specific amounts of additives, expressed as parts per hundred resion (pphr) (Rhodorsil PI 2074, CPTX, phenothiazine, Si-75, AO-80 and Naugard 445) were mixed in an appropriately sized amber HDPE bottle with an appropriate amount of MAK for F1 and PGMEA for F2-F8. The mixture was rolled for 18 hours to produce a homogeneous solution. Particle contamination was removed by filtering the polymer solution through a 1 μm pore nylon disc filter under 35 psi pressure, the filtered polymer solution was collected a low particle HDPE amber bottle and the resulting solution stored at 5° C.

TABLE 4

Solvent developable photoactive formulations

| Formulation | F1 | F2 | F3 | F4 | F5 | F6 | F7 | F8 |
|---|---|---|---|---|---|---|---|---|
| Rhodorsil PI 2074 | 5.6 | 2 | | 2 | 2.8 | 2.8 | 5.6 | 2 |
| GSID-26-1 | | | 2 | | | | | |

TABLE 4-continued

Solvent developable photoactive formulations

| Formulation | F1 | F2 | F3 | F4 | F5 | F6 | F7 | F8 |
|---|---|---|---|---|---|---|---|---|
| CPTX | 1.2 | 0.6 | — | 0.6 | 0.6 | 0.6 | 1.2 | 0.6 |
| Phenothiazine | 0.36 | 0.14 | 0.14 | 0.14 | 0.18 | 0.18 | 0.36 | 0.14 |
| Cyclohexane Divinyl Ether | | | | | 5 | | | |
| Antioxidant 80 | 5 | 5 | 5 | 5 | 5 | 5 | 5 | |
| Irganox 1076 | | | | | | | | 1.5 |
| Naugard 445 | 5 | 5 | 5 | 5 | | 5 | 5 | |
| KBM-403E | 5 | | | 5 | 5 | 2.5 | 5 | 5 |
| Si-75 | 3 | 3 | 3 | 3 | 3 | 2.5 | 3 | |
| SIB-1832 | 10 | | | | | 5 | 10 | |

ChipStack/RDL Aqueous Base (0.26N TMAH) Develop Formulations

Formulation F9: A 57.3 weight % solution of polymer P1 in PGMEA (31.3 g), TrisP-3M6C-2(5)-201 (3.10 g), BY-1,6-15 (1.86 g), SIB-1832 (1.25 g), Denacol EX-321L (0.62 g), Si-75 (0.38 g), Naugard 445 (1.24 g), AO-80 (0.81 g) and PGMEA (9.82 g) were mixed in an appropriately sized amber HDPE bottle. The mixture was rolled for 16 hours to produce a homogeneous solution. Particle contamination was removed by filtering the polymer solution through a 0.2 μm pore PTFE disc filter under 35 psi pressure, the filtered polymer solution was collected a low particle HDPE amber bottle and the resulting solution stored at −5° C.

The above procedure was repeated using TrisP-3M6C-2 (4)-201 to form Formulation F10 and this procedure was used as a template to make formulations F11-F16, each of which include an additional 10 pphr of the experimental hindered phenol compound indicated. Each of such hindered phenol additives being distinct from one another and represented by Structural Formula II:

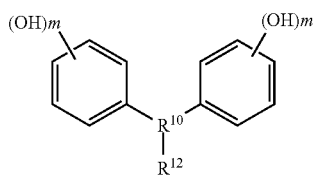

where $R^{10}$ is methylene or a $C_2$-$C_{12}$ substituted or unsubstituted alkylene or cycloalkylene, $R^{12}$, if present, is a $C_1$-$C_{12}$ substituted or unsubstituted alkyl, and m is independently either 0, 1 or 2.

As will be discussed below, these formulations were evaluated with regard to image threshold energy to determine the impact, if any, that the experimental hindered phenols (EHPs) exhibited.

TABLE 5

Aqueous Base Developable Photoactive Formulations

| Formulation | F9 | F10 | F11 | F12 | F13 | F14 | F15 | F16 |
|---|---|---|---|---|---|---|---|---|
| TrisP-3M6C-2(5)-201 | 25 | | | | | | | |
| TrisP-3M6C-2(4)-201 | | 25 | 25 | 25 | 25 | 25 | 25 | 25 |
| BY-16-115 | 15 | 15 | 15 | 15 | 15 | 15 | 15 | 15 |
| Denacol-EX321L | 5 | 5 | 5 | 5 | 5 | 5 | 5 | 5 |
| SIB-1832 | 10 | 10 | 10 | 10 | 10 | 10 | 10 | 10 |
| Si-75 | 3 | 3 | 3 | 3 | 3 | 3 | 3 | 3 |
| Naugard 445 | 10 | 10 | 10 | 10 | 10 | 10 | 10 | 10 |

TABLE 5-continued

Aqueous Base Developable Photoactive Formulations

| Formulation | F9 | F10 | F11 | F12 | F13 | F14 | F15 | F16 |
|---|---|---|---|---|---|---|---|---|
| AO-80 | 6.5 | 6.5 | 6.5 | 6.5 | 6.5 | 6.5 | 6.5 | 6.5 |
| EHP 1 | | 10 | | | | | | |
| EHP 2 | | | 10 | | | | | |
| EHP 3 | | | | 10 | | | | |
| EHP 4 | | | | | 10 | | | |
| EHP 5 | | | | | | | 10 | |
| EHP 6 | | | | | | | | 10 |

Characterization Data
Threshold Energy (Eth) Measurement

Formulations F9-F16 were each applied to a 200 mm diameter silicon wafer (thickness: 725 µm) by spin coating. The substrate was then placed on a 100° C. hot plate for 300 seconds, providing a film about 10 µm thick polymer film. Each polymer film was then imagewise exposed through using a range of exposure energies from 50-730 mJ/cm$^2$. Each film was then developed using a puddle development method having two 30 second immersions in 0.26N TMAH. After the develop process each wafer was rinsed by spraying deionized water for 5 seconds and then dried by spinning at 3000 rpm for 15 seconds. Each film was then evaluated to determine the threshold energy required to give a 100 µm square via hole. The specific compositions of formulations F9-F16 is provided in Table 5 above. As seen in Table 5A, below, each of Formulations F11-F13 and F16 exhibited a lower threshold energy than formulation F10, thus demonstrating that some of the experimental hindered phenol additives improved the observed sensitivity of the imagable polymer film.

Measured $E_{th}$ values for formulations F10-F16 are summarized in Table 5A below.

TABLE 5A

Measured $E_{th}$ Values

| Formulation | Thickness Loss | Eth (100 µm via) |
|---|---|---|
| F10 | 0.00 | 320 |
| F11 | 0.04 | 300 |
| F12 | 0.02 | 290 |
| F13 | 0.04 | 280 |
| F14 | 0.02 | 330 |
| F15 | 0.05 | 330 |
| F16 | 0.05 | 280 |

Water Vapor Transmission Rate (WVTR)

Water vapor transmission data were collected following ASTM E96, Procedure B (water and desiccant) as follows. Approximately 100 mL of deionized water was added to each water vapor transmission fixture such that the level was within ¼" of where the test specimen would be located. Each test specimen was then mounted onto a fixture and secured using the knurled set screws and gasket All of the fixtures were then initially weighed to the nearest 0.01 g and placed into a temperature/humidity chamber maintained at 23° C. and 50% relative humidity (R.H.). Once the first fixture was placed into the chamber, a stopwatch was started to monitor each test specimen's exposure time. The elapsed time was then recorded for each additional fixture added to the chamber. At periodic intervals, each fixture was removed from the chamber and once again weighed to the nearest 0.01 g. The elapsed time was also recorded and the fixture was placed back in the chamber. Typically, an overall weight change for the material under test equivalent to 100 times the balance sensitivity is desired. The Water Vapor Transmission (WVT) value for each test specimen was calculated using the slope of the plotted data points and the following equation:

$$WVT = (G/t)1/A$$

where G=weight change, in grams; t=elapsed time in which G has occurred, in hours; (G/t)=slope of the straight regression line, g/hr or g/day; and A=sample test area, in square meters.

A free-standing, 110-140 µm thick film of polymer formulation F2 was prepared as follows: 100 g of the formulation F2 was poured onto a glass plate (14"×8.5") wide and drawn into a uniform layer using a film casting knife (BYK-Gardner PAG-4340) with a gap height of 0.025 inches. The films were dried for 72 hours at ambient temperature and then exposed to 1 J/cm$^2$ of broad band UV radiation and cured at 180° C. under a nitrogen atmosphere for 120 minutes. The cured films were lifted from the glass substrate by immersion in a 1 weight % aqueous HF bath for 18 hours and then dried in air for 24 hours. The water vapor transmission rate of the polymer film was measured by ASTM E96 Procedure B (water and desiccant) at 23° C. and 50% Relative humidity for 7 days. The film was found to have a water vapor transmission rate of 141.2 gram/square meter/day.

TABLE 6

Water Vapor Transmission Rate

| Formulation | Film thickness (µm) | WVTR (g/m$^2$/day) |
|---|---|---|
| F2 | 132 | 141.2 |
| F3 | 127 | 160.1 |
| F4 | 119 | 142.8 |
| F5 | 127 | 135.8 |
| F6 | 123 | 45.6 |
| F7 | 123 | 32.6 |
| F8 | 125 | 191 |
| F9 | 118 | 17.4 |
| Avatrel 2580-40 | 136 | 19.6 |

Sample Preparation for Isothermal TGA Analysis

A series of formulations, F18-F30, were prepared in order to confirm the efficacy of the NG445 additive as a stabilizer during the thermal cure of the NBTON repeat unit side chain in, for example polymers P1 and P2 copolymers. Formulation examples were prepared in the manner described above for formulations F10-F16 but where Formulations F18-F24 include polymer P1 and formulations F25-31 include polymer P2. And further, for each formulation, the amount of each additive included in each formulation is indicated in Table 7 below.

After forming, for each formulation a 4 mL aliquot was spin coated onto a 125 mm Si wafer at 750 rpm for 30 seconds using a CEE 100CBX spin coating station. The film was dried by baking on a hot plate at 100° C. for 4 minutes. The film was exposed to a 1 J/cm$^2$ blanket exposure of 365 nm UV light and post exposure baked on a hot plate for 5 minutes at 90° C. A portion of each film was removed from the wafer, placed in a platinum thermal analysis pan (TA) and weighed. The portion was then baked at 180° C. for 2 hours under a nitrogen atmosphere in a TA Q500 TGA Thermogravimetric Analyzer. The percent weight (wt %) loss of each portion is reported in Table 7, below. As it can be seen, for samples without the photoacid Rhodorsil, or samples with such photoacid and NG-445, weight loss is minimal. However, absent NG-445, the weight loss is significant for each of the two polymers. Without wishing to be bound by theory, the apparent enhanced stability of the P2 samples is believed to be the result of the higher mol % of NBTON, as compared to P1, cross-linking more efficiently. While formulations F24 and F31 are analogous to formulations F19 and F26 in that they do not contain NG-445 but do contain a strong acid (Pyridinium Triflate rather than Rhodorsil) it is believed that the lower weight loss seen, for example F19 21.38% versus F24 1.87%, is indicative of Rhodorsil being a significantly stronger acid than pyridinium triflate.

TABLE 7

Thermal Stability of NBTON/MGENB Polymers (NG-445)

| Ex. # | Rhodorsil | Pyridinium Triflate | CPTX | NG-445 | AO-80 | Weight Loss |
|---|---|---|---|---|---|---|
| F18 | 0 | 0 | 0 | 0 | 0 | 0.41 |
| F19 | 0.33 | 0 | 0 | 0 | 0 | 21.38 |
| F20 | 0.33 | 0 | 0.1 | 0 | 0 | 21.89 |
| F21 | 0.33 | 0 | 0.1 | 0.83 | 0 | 0.55 |
| F22 | 0.33 | 0 | 0.1 | 0 | 0.83 | 21.3 |
| F23 | 0.33 | 0 | 0.1 | 0.83 | 0.83 | 0.69 |
| F24 | 0 | 0.33 | 0 | 0 | 0 | 1.87 |
| F25 | 0 | 0 | 0 | 0 | 0 | 1.99 |
| F26 | 0.33 | 0 | 0 | 0 | 0 | 16.72 |
| F27 | 0.33 | 0 | 0.1 | 0 | 0 | 15.47 |
| F28 | 0.33 | 0 | 0.1 | 0.83 | 0 | 0.9 |
| F29 | 0.33 | 0 | 0.1 | 0 | 0.83 | 15.09 |
| F30 | 0.33 | 0 | 0.1 | 0.83 | 0.83 | 1.14 |
| F31 | 0 | 0.33 | 0 | 0 | 0 | 3.15 |

Sample Preparation for DMA and Tensile Testing (Mechanical Property Testing)

Formulations F32-F43 were prepared in the manner described for Formulation F1, above. The specific base polymer and formulation for each of the examples is shown in Table 8.

TABLE 8

Formulations for DMA Testing

| Formulation | Base Polymer | Formulation Recipe |
|---|---|---|
| F32 | P2 | F5 |
| F33 | P2 | F6 |
| F34 | P3 | F7 |
| F35 | P3 | F5 |
| F36 | P1 | F2 |
| F37 | P2 | F2 |
| F38 | P1 | F2 |
| F39 | P2 | F2 |
| F40 | P2 | F3 |
| F41 | P7 | F2 |
| F42 | P6 | F2 |
| F43 | P4 | F2 |

An 8 mL aliquot of each of formulations F32-F43 was spin cast onto a series of 125 mm Si wafers at 420 rpm for 90 seconds using a CEE 100CBX spin coating station. The films were dried by baking on a hot plate in proximity mode at 100° C. for 10 minutes. Each dried film was then exposed to a 1 J/cm² blanket exposure of 365 nm UV light and post exposure baked on a hot plate for 10 minutes at 90° C. Each wafer was then additionally heated in a Despatch LAC High Performance Oven at 180° C. under a nitrogen atmosphere for 120 minutes to complete the crosslinking of the pendant epoxide functional groups. Each Si wafer was diced in to 10 mm wide strips and the polymer film on each strip lifted by immersion in a 1% aqueous HF bath at ambient temperature for approximately 24 hours, after which the strips were dried in air for 24 hours before testing.

The tensile properties of each sample was tested using an Instron 5564 Dual Column Tensile Tester with a rate of sample elongation of 5 nanometers (nm) per second at ambient temperature.

Dynamic Mechanical Analysis (DMA) was performed on a TA Instruments Q800 DMA over a temperature range of −75° C. to 250° C. at a heating rate of 2° C./minute with a sample strain amplitude of 15 µm and a frequency of 1.0 Hz. The CTE was reported as the slope of the curve between 140° C. and 180° C. Modulus and tensile strength are reported in Table 8 as gigaPascals (GPa) and megaPascals (MPa), respectively, while elongation to break is reported as a percentage and the transition temperatures in Table 9 as degrees Celsius.

TABLE 9a

Tensile Properties for Formulations F32-F43

| Formulation | Modulus | Tensile strength | Elongation to Break |
|---|---|---|---|
| F32 | 1.39 | 31.9 | 9.5 |
| F33 | 0.37 | 10.2 | 20.6 |
| F34 | 0.21 | 6.4 | 26.0 |
| F35 | 1.50 | 38.4 | 21.6 |
| F36 | 0.8 | 17.8 | 15.9 |
| F37 | 0.36 | 10.8 | 22.9 |
| F38 | 0.73 | 16.5 | 14.3 |
| F39 | 0.39 | 10.3 | 18.1 |
| F40 | 0.31 | 9.9 | 21.6 |
| F41 | 0.29 | 8.2 | 10.4 |
| F42 | 0.52 | 11.7 | 12.9 |
| F43 | 1.88 | 34.4 | 6.9 |

TABLE 9b

Dynamic Mechanical Analysis Transition Temperatures

| Formulation | Transition #1 β Transition (° C.) | Transition #2 Tg (° C.) |
|---|---|---|
| F32 | −42.3 | 144.5 |
| F33 | 21.9 | 59.6 |
| F34 | — | 27.1 |
| F35 | −54.6 | 154.0 |
| F36 | 42.1 | 74.6 |
| F37 | 21.3 | 61.0 |
| F38 | 39.4 | 77.9 |
| F39 | * | 64.3 |
| F40 | * | 67.13 |
| F41 | 20.3 | 58.5 |
| F42 | — | 73.4 |
| F43 | 76.9 | 118.2 |

Oxidative Stability of Aqueous Avatrel

For Formulation Examples F44 through F53 the polymer composition encompassed polymer P9 dissolved in a PGMEA carrier solvent. For Formulation Examples F55 and F56 the polymer composition encompassed polymer P14 dissolved in a PGMEA carrier solvent. Formulations F48 through F52 are polymer compositions that encompass P9, AO-80, and the diarylamines shown in Table 11.

Formulation F54 encompasses P9 with Naugard-445 and the antioxidant 4-PC [2,2'-methylenebis[6-[(2-hydroxy-5-methylphenyl)methyl]-4-methyl-phenol (CAS #20837-68-7)] in place of AO-80.

Each of the formulations shown in Table 11 encompasses each of the additives shown in Table 10. The amount of each additive employed is presented in parts per hundred (pphr) polymer and is therefore based on the polymer (pphr) loading.

TABLE 10

Base Polymer Composition Formulation

| Formulation | Amount (pphr polymer) |
|---|---|
| Polymer | P9 |
| TrisP-3M6C-2(5)-201 | 25 |
| BY-16-115 | 15 |
| Denacol-EX321L | 5 |
| SIB-1832 | 10 |
| Si-75 | 3 |

In addition to the additives shown in Table 10, each formulation includes a phenolic antioxidant (AO) and a diaryl amine synergist (DAS). The lithographic, speed and resolution of formulations F44 through F56 are shown in Table 11, below. It should be noted that the phenolic antioxidant employed was AO-80 for all formulations except for F52 and F54, where 4-PC and Irganox 1010 were used, respectively. With regard to the diarylamine synergist, NG-445 was employed for all formulations except for F48, F49, F50 and F51 where 4,4'-di-tert-butyl diphenylamine, Irganox 5057, Thermoflex and Agerite White were used, respectively. Furthermore, all additive loadings are expressed as parts per hundred resin (pphr), photospeed is expressed as millijoules per centimeter squared (mJ/cm$^2$) and resolution is of a line and space structure and expressed as micrometers (µm). All of the formulations were prepared using the procedure presented above for Formulation F1 but where the specific materials and loadings are presented in Tables 10 and 11, above and below. Therefore it will be understood that the preparation of Formulation F3 is for illustrative purposes only.

TABLE 11

Screening Antioxidants for Photospeed and Resolution

| Ex. # | Polymer | AO Loading | DAS Loading | Lithography Photospeed | Resolution |
|---|---|---|---|---|---|
| F44 | P9 | 0 | 0 | 404 | 7 |
| F45 | P9 | 10 | 0 | 404 | 7 |
| F46 | P9 | 6.5 | 10 | 404 | 7 |
| F47 | P9 | 10 | 10 | 404 | 7 |
| F48 | P9 | 6.5 | 10 | 404 | 10 |
| F49 | P9 | 10 | 10 | 404 | 10 |
| F50 | P9 | 10 | 10 | 404 | 25 |
| F51 | P9 | 10 | 10 | 404 | 5 |
| F52 | P9 | 6.5 | 10 | 404 | 10 |
| F53 | P12 | 0 | 0 | 976 | 100 |
| F54 | P12 | 10 | 0 | 976 | 100 |
| F55 | P14 | 0 | 0 | 976 | 100 |
| F56 | P14 | 10 | 10 | 976 | 100 |

An optimization of the formulation additives to balance improved oxidative stability and photolithography properties was completed. Formulations F57 to F68, made using polymer P9, are listed in Table 12 below.

A series of silicon wafers were coated with a thick film of each of polymer formulations F57-F68 and then blanket exposed to 1 J/cm$^2$ dose of 365 nm UV light. After exposure, each wafer was baked in a Despatch LAC High Performance Oven at a 180° C. under a nitrogen atmosphere for 120 minutes to complete the crosslinking of the multifunctional epoxide formulation additives Denacol EX-321L, BY16-115, TrisP-3M6C-2(5)-201 and SIB-1832.

The wafers were then placed in a Lindburg Blue-M oven heated at 150° C. for up to 200 hours in an air atmosphere. Each wafer was diced into 10 mm wide strips and the polymer film lifted from the strips by immersion in a 1% aqueous HF bath at ambient temperature. Each film was dried in air for 24 hours and the tensile properties tested using an Instron 5564 Dual Column Tensile Tester. The test results being shown in FIGS. 3-5 as normalized values to allow an optimized formation to be selected.

Thermo-oxidative degradation of a PNB polymer is accompanied by the loss of elongation to break due to (a) the loss of the polyether functional sidechain or (b) further crosslinking of the polymer film.

TABLE 12

Optimization of Antioxidant Package in P9

Formulation Additive Loading (pphr)

| Ex. # | Si-75 | NG-445 | AO-80 | 22M46 | †† | BY16-115 | ** | SIB-1832 |
|---|---|---|---|---|---|---|---|---|
| F57 | 8.23 | 8.27 | 3.00 | | 25 | 15 | 5 | 10 |
| F58 | 5.44 | 10.00 | 4.06 | | 25 | 15 | 5 | 10 |
| F59 | 10.00 | 5.38 | 4.12 | | 25 | 15 | 5 | 10 |
| F60 | 10.00 | 3.00 | 6.50 | | 25 | 15 | 5 | 10 |
| F61 | 3.00 | 10.00 | 6.50 | | 25 | 15 | 5 | 10 |
| F62 | 6.36 | 6.37 | 6.77 | | 25 | 15 | 5 | 10 |
| F63 | 7.63 | 4.11 | 7.76 | | 25 | 15 | 5 | 10 |
| F64 | 6.50 | 3.00 | 10.00 | | 25 | 15 | 5 | 10 |
| F65 | 3.00 | 6.50 | 10.00 | | 25 | 15 | 5 | 10 |
| F66 | 6.36 | 6.37 | 0.00 | 6.77 | 25 | 15 | 5 | 10 |
| F67 | 6.36 | 6.37 | 6.77 | | 25 | 15 | 5 | 0.00 |
| F68 | 10.00 | 10.00 | 10.00 | | 25 | 15 | 5 | 10 |

†† TrisP-3M6C-2(5)-201
** Denacol EX-321L

Device Build Examples

CIS Cavity Package

A 125 mm SiO$_2$ wafer was placed in a March CS-1701 reactive ion etch (RIE tool) and the surface was cleaned with a mixed oxygen-argon plasma (300 mtorr, 300 W, 30 seconds). An 8 mL aliquot of formulation F37 was spin cast onto a 125 mm Si wafer (625 µm thick) at 1200 rpm for 60 seconds and then at 3000 rpm for 10 seconds using a CEE 100CBX spin coating station. The film was dried by baking on a hot plate in proximity mode at 100° C. for 5 minutes. The polymer film was imagewise exposed through a negative tone mask with a grid pattern of 500 µm square via openings to a 780 mJ/cm$^2$ dose of 365 nm UV light and then baked on a hot plate for a further 4 minutes at 90° C. The unexposed portion of the polymer film was developed by spraying with MAK solvent for 21 seconds onto the wafer as it was spinning at 150 rpm. The polymer film was then rinsed with a spray of isopropanol for 5 seconds. The polymer film was dried in air for 18 hours.

A 125 mm borofloat glass wafer (350 µm thick) was placed in a March CS-1701 reactive ion etch (RIE tool) and the surface was cleaned with a mixed oxygen-argon plasma (300 mtorr, 300 W, 30 seconds). The treated surface of the glass wafer was placed in contact with the polymer film on the glass wafer and the wafer stack was placed into a Suss Bonder which had been preheated to 90° C. The tool was sealed and the chamber evacuated to 5×10$^{-4}$ mbar and then the sample was heated to 110° C. at a rate of 10° C. per minute. The bonding pressure was raised to 1 MPa for 3 minutes in order to create a thermo-compression bond between the polymer dam and the glass wafer. The pressure was released and the sample was cooled to 90° C. before removal from the bonder. The wafers were baked in a Despatch LAC High Performance Oven a temperature of 180° C. under a nitrogen atmosphere for 120 minutes to complete the crosslinking of the pendant epoxide functional groups and develop chemical bonding of the polymer to the wafer substrates.

Alternate Bonding Condition

A 100 mm glass wafer was pretreated with Piranha solution cleaned for 15 minutes, then rinsed with deionized water and dried before bonding. A 125 mm Si wafer coated with a 50 μm thick polymer dam was placed on the bottom chuck of the EVG 501 bonder. The 4" glass wafer was placed on top of the 5" coated wafer and a 20 N force was applied to prevent glass wafer from shifting. The chamber was cycled 3 times with vacuum followed by nitrogen purge. The tool was sealed and chamber was evacuated. The bonding force of 6000 N (bonding pressure about 1.0 MPa) was applied. The temperature was ramped to 200° C. for both top and bottom chucks. The 6000 N bond force and 200° C. bond temperature were maintained for 30 minutes. The chamber was cooled to room temperature, pressure was released and wafer was unloaded. The bonded wafer was cured at 180° C. for 120 minutes under nitrogen.

Comparative Example

A 125 mm $SiO_2$ wafer was placed in a March CS-1701 reactive ion etch (RIE tool) and the surface was cleaned with a mixed oxygen-argon plasma (300 mtorr, 300 W, 30 seconds). An 8 mL aliquot of a commercially available epoxide adhesive was spin cast onto a 125 mm Si wafer (625 μm thick) at 1600 rpm for 30 seconds using a CEE 100CBX spin coating station. The edge-bead was removed using a 15 second PGMEA spray. The film was dried by baking on a hot plate in proximity mode at 80° C. for 2 minutes. The polymer film was imagewise exposed through a negative tone mask with a grid pattern of 500 μm square via openings to a 250 mJ/cm$^2$ dose of 365 nm UV light and then baked on a hot plate for a further 2 minutes at 90° C. The unexposed portion of the polymer film was developed by immersing the wafer in a bath of PGMEA solvent for 5 minutes with slight agitation. The polymer film was then rinsed with a spray of isopropanol for 5 seconds. The polymer film was dried in air for 18 hours.

A 125 mm glass wafer (350 μm thick) was placed in a March CS-1701 reactive ion etch (RIE tool) and the surface was cleaned with a mixed oxygen-argon plasma (300 mtorr, 300 W, 30 seconds). The treated surface of the glass wafer was placed in contact with the polymer film on the glass wafer and the wafer stack was placed into a Suss Bonder at ambient temperature. The tool was sealed and the chamber evacuated to $5 \times 10^{-4}$ mbar and then the sample was heated to 110° C. at a rate of 10° C. per minute. The bonding pressure was raised to 1 MPa for 3 minutes in order to create a thermo-compression bond between the polymer dam and the glass wafer. The pressure was released and the sample was cooled to ambient temperature before removal from the bonder. The wafers were baked in a Despatch LAC High Performance Oven a temperature of 180° C. under a nitrogen atmosphere for 120 minutes to complete the crosslinking of the pendant epoxide functional groups and develop chemical bonding of the polymer to the wafer substrates.

The bonded glass to wafer stack was then subjected to high temperature/high humidity 85° C./85% RH for 168 hours. Visual inspection of the encapsulated cavities using a Nikon OPTIPHOT-88 microscope immediately after removal from the ESPEC Temperature and Humidity Chamber SH-240 indicated whether fog or water droplets condensed in the cavities. The fog test reliability results are presented in Table 13 below. As it can be seen, CIS dam structures formed from polymer composition embodiments in accordance with the present invention outperform the commercially available epoxide adhesive under high humidity conditions.

TABLE 13

Results of Fog Testing

| Formulation | 168 hours @ 85° C./85% RH |
|---|---|
| F39 | No Fog |
| F40 | No Fog |
| F41 | No Fog |
| F42 | No Fog |
| F43 | No Fog |
| Comparative Material | Fog |

Chip Stack Device Fabrication

Formulation F9 was applied to a 200 mm diameter silicon wafer (thickness: 725 μm) by spin coating. The substrate was then placed on a 100° C. hot plate for 300 seconds providing a nominally 11.0 μm thick polymer film. Thereafter, the resin layer was subjected to a flood exposure at an exposure intensity of 25 mW/cm$^2$ for 40 seconds using a MA-8 mask aligner (Suss Microtec AG) without a masking element. After the flood exposure, the wafers were baked on a hot plate at 150° C. for 10 min.

Then, non-photosensitive type back grinding tape was laminated on the resin layer of the wafer, and the backside of the wafer opposite the resin layer was ground and dry polished to thin the silicon layer of the wafer to 50 μm thick. The back-grinding tape was subsequently removed.

Next, dicing tape was laminated on the backside surface of the wafer, and the wafer was cut by a dicing saw (DAD341, DISCO corp.) into 7 mm squares to obtain thinned silicon chips having a resin layer.

In parallel, dicing die-attach tape (IBF-8550C, Sumitomo Bakelite Co., Ltd.) was laminated to the backside surface of a second thinned wafer coated with the polymer adhesive layer on the opposite side. The wafer was then diced with the manner described above to obtain similar 7 mm square silicon chips.

Onto a bismaleimide-triazine resin laminate board substrate (thickness: 0.35 mm) coated with a 20 μm±5 μm thick layer of solder resist (PSR4000 AUS308, Taiyo Ink Mfg.) was mounted die containing the adhesion layer from the dicing die-attach tape. The chips were mounted (tape-side down, resin-side up) at a temperature of 130° C. and a pressure of 10 N for 2 seconds by using a chip placement tool BESTEM-D02 (Canon Machinery). On top of the mounted chip, another chip diced from the wafer without using dicing die-attach tape (i.e. without adhesion layer on ground surface) was bonded resin-side up at a temperature of 150° C. and a pressure of 10 N for 1 sec using the same apparatus to make chip stacked structure on a substrate. The stacked chip package substrate was heated at 175° C. for 15 minutes to approximate the thermal history of gold wire-bonding.

Then, the surface of the substrate mounted with the stacked chips was encapsulated with an encapsulating resin (EME-G760L, Sumitomo Bakelite Co., Ltd.) by transfer molding at a temperature of 175° C. and a pressure of 10 N for 1 minute by using a molding machine (Y1E, TOWA Co., Ltd.). The overmolded package on board containing multiple die stacks was then subjected to a heat treatment of 175° C. for 4 hours to cure both the coated resin layer and the encapsulating molding compound to thereby obtain semiconductor devices.

Nine semiconductor devices were selected from the aforementioned process. The devices were treated at a temperature of 85° C. and a humidity of 60% RH for 168 hours in an ESPEC Temperature & Humidity Chamber LHL-113; thereafter, they were passed through a reflow furnace at a temperature of 260° C. three times. Each of the semiconductor devices was investigated with respect to scanning acoustic tomography (SAT) measurement and cross-sectional observation after the reflow process. The examination of the semiconductor devices found no defects or interlayer delamination failures had occurred in any of the packages. In a separate set of 7 semiconductor devices from the same process, the devices were subjected to thermal-cycling conditions (−55° C.+125° C., 1000-cycle). No voids were detected via SAT or cross-sectional observation after thermal-cycling. Thus, it can be seen that polymer composition embodiments in accordance with the present invention can provide chip stack devices that both perform well under high humidity and through thermal cycling.

RDL Device Fabrication

Redistribution layer devices were prepared using formulation F9 and two commercially available comparative polymers Comparative Polymer 1 (CP1) and Comparative Polymer 2 (CP2). A total of three device wafers were prepared for each resin. The accumulated data for the devices appears below in Table 14. In the table, soft bake (SB), post expose bake (PEB) and cure data provides temperatures expressed in ° C. and time in minutes, exposure in mJ/cm² and resistance in ohms.

A series of 6" silicon wafers, each deposited with 2000 Å of PECVD nitride and 2000 Å of sputtered copper were spin-coated (~1 µm) with Shipley 1813 positive-tone photoresist and then soft baked on a hotplate at 110° C. for 3 minutes. The coated wafer was subjected to actinic radiation (90 mJ/cm², i-line) through a photomask. The features were developed in 0.26 N TMAH (Rohm & Haas, CD 26). After hard-baking (130° C., 3 min), the exposed copper metal in the developed areas was etched using copper etchant (Transene APS-100) to reveal two copper pads (75 µm diameter) connected by a copper trace (25 µm width). After deionized (DI) water rinse, the undeveloped photoresist was removed using acetone.

Each wafer having the patterned first copper traces was then subjected to reactive ion etch (25/19 sccm Ar/O₂, 300 W, 300 mtorr, 30 sec), spin-coated with one of Formulation F9, CP1 or CP2 and soft baked as indicated in Table 14. After soft bake, each layer was imagewise exposed through a masking element on an mask aligner through an i-line band pass filter to the exposure dose indicated in Table 14 for that formulation. Also as shown in Table 14, the CP1 wafers received a post exposure bake and were then joined with the other wafers for development of the latent pattern by spraying with 0.26 N TMAH aqueous developer to reveal 50 µm diameter via openings over pad portions of the first copper traces. Each patterned wafer was then cured for the time and temperature indicated in Table 14, in a N₂ atmosphere in a Despatch LAC High Performance Oven. Each of the wafers was then subjected to the indicated descum process in a March PX-500 Plasma Cleaning Tool.

The patterned films were then subjected to dilute copper etchant (25 wt % Transene APS-100, 4 sec), rinsed with water, then hard-baked (130° C., 3 min). Each wafer was then placed into a sputtering chamber (Denton Explorer 14), pre-cleaned with an argon plasma, then sputtered with titanium (200 Å) followed by copper (2000 Å). Next, each wafer was spin-coated with AZ 9260 and soft baked (110° C., 3 min) and imagewise exposed to actinic radiation (900 mJ/cm2, i-line) and developed in AZ 400K (1:2.5 wt/wt, 2 min), subjected to dilute copper etchant (4 sec) to remove any trace copper oxidation. After a DI water rinse the wafers were placed into an electroplating bath (Microfab SC Make-Up with SC MD brightener and SC LO 70/30 leveler) (400 mA, 6 min). After removal from the electroplating bath, the wafers were rinsed with DI water an the residual photoresist was stripped with acetone, and then the metal seed layers removed with appropriate copper then titanium etchants, thus revealing second metal traces on top of the various polymer redistribution layers. Electrical continuity and resistance of the second to first metal structures was then measured for each wafer and the average of those measurements reported in Table 14. As it can be seen, Formulation F9 provided results equal to or better than the commercially available CP1 and CP2 materials.

TABLE 14

Summary of RDL Device Example Data

| Formulation | SB temp/time | Exposure | PEB | Cure temp/time | Descum Conditions† | Resistance (Ω) |
|---|---|---|---|---|---|---|
| F9 | 100, 5 | 375 | — | 180, 120 | † | 1.9 |
| F9 | 100, 5 | 375 | — | 180, 120 | † | 1.8 |
| F9 | 100, 5 | 375 | — | 180, 120 | † | 2.2 |
| CP1 | 100, 5 | 250 | 100, 5 | 200, 120 | 25/19 sccm Ar/O₂, 300 W, 300 mtorr, 30 sec | 2.1 |
| CP1 | 100, 5 | 250 | 100, 5 | 200, 120 | 25/19 sccm Ar/O₂, 300 W, 300 mtorr, 30 sec | 2.0 |
| CP1 | 100, 5 | 250 | 100, 5 | 200, 120 | 25/19 sccm Ar/O₂, 300 W, 300 mtorr, 30 sec | 2.3 |
| CP2 | 120, 3 | 327 | — | 150, 30 320, 30 | † | 1.7 |
| CP2 | 120, 3 | 327 | — | 150, 30 320, 30 | † | 2.2 |
| CP2 | 120, 3 | 327 | — | 150, 30 320, 30 | † | 1.8 |

†Unless otherwise noted, 60/60 sccm of CF₄/O₂ was used in all descum operations at 600 W, 300 mtorr and for 60 sec.

By now it should be realized that the polymers composition embodiments in accordance with the present invention provide tailorable characteristics that allow for such compositions to provide desirable levels or values of stress, modulus, dielectric constant, elongation to break and permeability to water vapor for the applications for which they are intended. Further, it should be realized that such embodiments have been shown to be self-imagable, and can be formulated as either positive tone or negative tone compositions to allow for the formation of a desired device, such as the chip stack, RDL and CIS devices described above and below.

We claim:

1. A microelectronic or optoelectronic device comprising one or more of a redistribution layer (RDL) structure, a chip stack structure, a CMOS image sensor dam structure, where said structures further comprise a positive tone, self imagable composition, which contains a thermo-oxidatively stabilized polymer having repeating units derived from a norbornene-type monomer in accordance with Formula A:

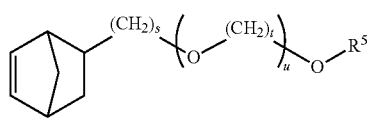

where s is selected from 0 to 3, t is 2, u is an integer from 1 to 3 and $R^5$ is selected from methyl, ethyl, n-propyl or i-propyl, and an additive package comprising one or more phenolic antioxidant selected from the group consisting of:

2,2'-((2-hydroxy-5-methyl-1,3-phenylene)bis(methylene))bis(4-methylphenol), 6,6'-methylenebis(2-(2-hydroxy-5-methylbenzyl)-4-methylphenol), 6,6'-2-hydroxy-5-methyl-1,3-phenylene)bis(methylene)bis(2-(2-hydroxy-5-methylbenzyl)-4-methylphenol), 6,6'-methylenebis(2-(2-hydroxy-3,5dimethylbenzyl-4-methylphenol), and 6,6'-(2-hydroxy-5-methyl-1,3-phenylene)bis(methylene)bis(2,4-dimethyphenol); and one or more diaryl amine synergist selected from the group consisting of:

N,N'-di-2-naphthyl-p-phenylenediamine,
bis(4-(tert-butyl)phenyl)amine,
bis(4-(2-phenylpropan-2-yl)phenyl)amine,
bis(4-(2,4,4-trimethylpentan-2-yl)phenyl)amine and
bis(4-(2,4,4-trimethylpentyl)phenyl)amine; and wherein each of said antioxidant and amine synergist is present in an amount from 3 to 10 parts per hundred parts of said polymer.

2. The microelectronic or optoelectronic device of claim 1, where the synergist is one or more of bis(4-(tert-butyl)phenyl)amine, bis(4-(2-phenylpropan-2-yl)phenyl)amine, or bis(4-(tert-pentyl)phenyl)amine and the phenolic antioxidant is one or more of 2,2'-((2-hydroxy-5-methyl-1,3-phenylene)bis(methylene))bis(4-methylphenol), or 6,6'-methylenebis(2-(2-hydroxy-5-methylbenzyl)-4-methylphenol).

3. The microelectronic or optoelectronic device of claim 2, where the synergist is bis(4-(2-phenylpropan-2-yl)phenyl) amine and the phenolic antioxidant is 2,2'-((2-hydroxy-5-methyl-1,3-phenylene)bis(methylene))bis(4-methylphenol).

4. The microelectronic or optoelectronic device of any of claims 1, 2 or 3 where the norbornene-type monomer in accordance with Formula A is trioxanonanenorbornene (NBTON) or tetraoxadodecanenorbornene (NBTODD).

5. The microelectronic or optoelectronic device of claim 4 where the thermo-oxidatively stabilized polymer further comprises repeating units derived from one or more norbornene-type monomers selected from norbornenyl-2-trifluoromethyl-3,3,3-trifluoropropan-2-ol (HFANB), norbornene methyl glycidyl ether (MGENB), 5-decylbicyclo[2.2.1]hept-2-ene (DecNB), 5-phenethylbicyclo[2.2.1]hept-2-ene (PENB), 5-phenbutylbicyclo[2.2.1]hept-2-ene (PBNB), ethyl 3-(bicyclo[2.2.1]hept-2-en-2-yl)propanoate (EPEsNB), 2-(6-(bicyclo[2.2.1]hept-5-en-2-yl)hexyl)oxirane (EONB), bicyclo[2.2.1]hept-5-ene-2-carboxylic acid (Acid NB) and norbornenylpropanoic acid (NBEtCOOH).

6. The microelectronic or optoelectronic device of claim 2, where said device comprises a CMOS image sensor dam structure.

7. The CMOS image sensor dam structure of claim 6, where the repeating units of the thermo-oxidatively stabilized polymer are derived from two or more monomers selected from trioxanonanenorbornene (NBTON), tetraoxadodecanenorbornene (NBTODD), 5-phenethylbicyclo[2.2.1]hept-2-ene (PENB), 5-phenbutylbicyclo[2.2.1]hept-2-ene (PBNB), 2-(6-(bicyclo[2.2.1]hept-5-en-2-yl)hexyl)oxirane (EONB), 5-decylbicyclo[2.2.1]hept-2-ene (DecNB) and norbornene methyl glycidyl ether (MGENB).

8. The microelectronic or optoelectronic device of claim 2, where said device comprises a chip stack structure.

9. The chip stack structure of claim 8, where the repeating units of the thermo-oxidatively stabilized polymer are derived from two or more monomers selected from trioxanonanenorbornene (NBTON), tetraoxadodecanenorbornene (NBTODD), norbornenyl-2-trifluoromethyl-3,3,3-trifluoropropan-2-ol (HFANB),-ethyl 3-(bicyclo[2.2.1]hept-2-en-2-yl)propanoate (EPEsNB) and trimethylsilyl bicyclo[2.2.1]hept-5-ene-2-carboxylate (NBCOOTMS).

10. The microelectronic or optoelectronic device of claim 2, where said device comprises a redistribution layer (RDL) structure.

11. The redistribution layer (RDL) structure of claim 10, where the repeating units of the thermo-oxidatively stabilized polymer are derived from two or more monomers selected from trioxanonanenorbornene (NBTON), tetraoxadodecanenorbornene (NBTODD), norbornenyl-2-trifluoromethyl-3,3,3-trifluoropropan-2-ol (HFANB), 5-decylbicyclo[2.2.1]hept-2-ene (DecNB), 2-(6-(bicyclo[2.2.1]hept-5-en-2-yl)hexyl)oxirane (EONB), ethyl 3-(bicyclo[2.2.1]hept-2-en-2-yl)propanoate (EPEsNB), trimethylsilyl bicyclo[2.2.1]hept-5-ene-2-carboxylate (NBCOOTMS) and norbornene methyl glycidyl ether (MGENB).

* * * * *